United States Patent
Kiguchi et al.

(10) Patent No.: US 7,070,890 B2
(45) Date of Patent: *Jul. 4, 2006

(54) COLOR FILTER AND MANUFACTURING METHOD THEREFOR

(75) Inventors: Hiroshi Kiguchi, Suwa (JP); Natsuo Fujimori, Suwa (JP); Satoru Katagami, Hara-mura (JP); Masaharu Shimizu, Hara-mura (JP); Keiji Takizawa, Suwa (JP); Tadaaki Kuno, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 268 days.

This patent is subject to a terminal disclaimer.

(21) Appl. No.: 10/640,255

(22) Filed: Aug. 14, 2003

(65) Prior Publication Data
US 2004/0038138 A1    Feb. 26, 2004

Related U.S. Application Data

(62) Division of application No. 09/622,368, filed as application No. PCT/JP99/07081 on Dec. 16, 1999, now Pat. No. 6,630,274.

(30) Foreign Application Priority Data

| Dec. 21, 1998 | (JP) | ................................. 10-363277 |
| Feb. 4, 1999 | (JP) | ................................. 11-027450 |
| Aug. 24, 1999 | (JP) | ................................. 11-236923 |

(51) Int. Cl.
G02B 5/20 (2006.01)
G02F 1/1335 (2006.01)

(52) U.S. Cl. .......................................... 430/7; 347/106
(58) Field of Classification Search ..................... None
See application file for complete search history.

(56) References Cited

U.S. PATENT DOCUMENTS

| 5,340,619 A | 8/1994 | Chen et al. |
| 5,716,740 A | 2/1998 | Shiba et al. |
| 5,948,577 A | 9/1999 | Nakazawa et al. |
| 6,630,274 B1 * | 10/2003 | Kiguchi et al. ................. 430/7 |

FOREIGN PATENT DOCUMENTS

| JP | 59-75205 | 4/1984 |
| JP | 4-195102 | 7/1992 |
| JP | 5-241011 | 9/1993 |
| JP | 5-241012 A | 9/1993 |
| JP | 06 118217 A | 4/1994 |
| JP | 7-35915 | 2/1995 |
| JP | 7-35917 | 2/1995 |
| JP | 8-166507 A | 6/1996 |
| JP | 10-142418 | 5/1998 |
| JP | 10-197715 A | 7/1998 |

* cited by examiner

Primary Examiner—John A. McPherson
(74) Attorney, Agent, or Firm—Oliff & Berridge PLC

(57) ABSTRACT

The color filter of the present invention comprises ink films colored by ink drops 140 inside openings 111 enclosed by banks 112 demarcated and formed on a substrate 110. The banks 112 have a laminar structure comprising a metal film 120 and a photosensitive organic thin film 130 from the substrate 110 side. The inks should contain a solvent having a high boiling point. The bank layer may also be configured so that the peripheral edges of the bottom surface thereof are positioned inside from the peripheral edges of the light blocking layers, so that the light blocking layers have exposed surfaces on the upper surface thereof where the bank layer is not superimposed. Thus color filters can be provided which exhibit outstanding contrast without coloring irregularities.

8 Claims, 16 Drawing Sheets

COLOR FILTER AND MANUFACTURING METHOD THEREFOR

This is a Division of application Ser. No. 09/622,368 filed Aug. 16, 2000, now U.S. Pat. No. 6,630,274, which in turn is a U.S. National Stage Application, which claims the benefit of International Application No. PCT/JP99/07081 filed Dec. 16, 1999. The entire disclosure of the prior applications is hereby incorporated by reference herein in its entirety.

TECHNICAL FIELD

This invention relates to color filters used in liquid crystal display elements and the like, and more particularly to color filters, and to a manufacturing method therefor, that have a structure well suited to color filters wherein a minute droplet discharge method is applied which is based on an ink jet method. The present invention also relates to liquid crystal display devices, electro-optical devices, and electronic equipment comprising such color filters, and to manufacturing methods therefor.

BACKGROUND ART

The demand for liquid crystal color displays has been increasing rapidly in recent years in conjunction with the advances being made in personal computers in general and portable personal computers in particular. In responding to this demand, high priority is now being given to establishing means for supplying beautiful displays at reasonable cost. At the same time, in recent years, protecting the environment has become a big issue, and high priority is being given to making improvements in or converting to processes that will reduce the impact on the environment.

A number or methods are known conventionally for manufacturing color filters. One example is to pattern a light blocking material that is a thin film of chromium by photolithography and etching to form a black matrix. Then red, green, and blue photosensitive resins are applied to the gaps in that black matrix, one color at a time, by a spin coating method or the like, after which patterning is done by photolithography. In that way a color matrix can be configured wherein red, green, and blue coloring layers are deployed adjacent to each other. With this manufacturing method, however, the photolithographic process must be repeated for each of the red, green, and blue colors. Not only so, but the elimination of unneeded portions when patterning each color results in losses of photosensitive resist material. Thus this method tends to have a high impact on the environment and produce high-cost color filters.

In Japanese Patent Laid-Open Publication No. S59-75205, a method is proposed wherein an ink jet method is employed. In this method, ink coating gap partitions are formed in a matrix pattern on a transparent substrate, using a material that exhibits low ink wettability, after which a coloring layer is formed by applying non-photosensitive coloring materials inside the partitions using an ink jet method. By using this manufacturing method, the tediousness of the photolithographic processes can be alleviated, and it has become possible to reduce color material losses. Subsequently, many color filter manufacturing methods have been proposed which employ non-photosensitive coloring material application processes based on an ink jet method.

In one example, a chromium film is formed on a glass substrate using a sputtering film-forming method, this is etched in a prescribed pattern to form openings (pixels or light-transmitting areas), and those openings are filled with ink drops, thus manufacturing a color filter.

In many methods, a black photosensitive resin composition is used as the light blocking material, and, thereby, a bank layer is formed to partition the areas that are to be coated with coloring materials in a matrix pattern. In these methods, the surface of the bank layer that functions as a black matrix is imparted with an ink repelling quality, and color mixing caused by bank layer overflows in the color material application process is prevented.

In the art disclosed in Japanese Patent Laid-Open Publication No. H4-195102, Japanese Patent Laid-Open Publication No. H7-35915, Japanese Patent Laid-Open Publication No. H7-35917, and Japanese Patent Laid-Open Publication No. H10-142418, for example, in every case, a difference in ink wettability is elicited between the bank layer and the transparent substrate by the selection of the resin materials configuring the black matrix and by surface processing done on the surface of the transparent substrate in areas where coloring materials are applied.

When a chromium film is formed by a sputtering film forming method to form the banks, however, the limitation on the film thickness is about $0.2\mu$, and banks having sufficient height ($0.5\mu$ to $10\mu$) for ink filling cannot be formed. Also, when the interiors of openings enclosed by banks are filled with ink drops by the ink jet method, it is necessary to prevent the ink drops from crossing over the banks so that they overflow into neighboring pixels, making it necessary to impart ink affinity to the substrate and ink repellency to the banks. Hence it is preferable that the upper parts of the banks be configured by materials such as organic materials that may be readily subjected to ink repellency treatment.

Thereupon, in view of the problems noted in the foregoing, an object of the present invention is to provide color filters and liquid crystal elements comprising banks that are ideal for methods of manufacturing color filters by filling banks with ink by the ink jet method. Another object thereof is to provide a color filter manufacturing method well suited to the ink jet method.

When, on the other hand, a photosensitive black resin composition is used for the light blocking material in forming the black matrix, it is very difficult to obtain the right balance between light transmissivity and resin hardness. In actual practice, film thickness variation in the black matrix layer, which functions as the bank layer, is unavoidable because the film thickness is large. When a negative resist is used, for example, where the film thickness is thick, portions develop in the lithographic process that do not adequately transmit light, whereupon unhardened portions remain. When such unhardened portions as these are present, it is sometimes not possible to obtain sufficient film strength in the black matrix layer. Places where the film thickness is thin in the black matrix layer, on the other hand, become semi-transparent so that adequate light blocking properties are not obtained, sometimes leading to the occurrence of light leakage.

In recent years, color filters have become increasingly more high precision, making it necessary to form very fine red, green, and blue pixels that are a few tens of $\mu$ square, with good coloring material bonding, while minimizing color tone variation. With the conventional art however, making the contact angles of the resin banks that demarcate and partition the pixels on the large size becomes a cause of pixel bonding flaws due to resin components spattering about the periphery. In methods which combine such dry etching processes as UV irradiation, plasma etching, and laser ablation for the purpose of preventing such bonding flaws, selectively processing only the gap portions where the ink is to be deployed becomes increasingly difficult the finer the patterns become. For this reason, the bank portions also end up getting processed at the same time, which only causes the contact angle to decline significantly. That is, attempts to make the difference in contact angle between the transparent substrate surface portion where the coloring material of the increasingly minute pixels adheres and the black resin banks that demarcate those portions particularly large are not very effective, especially in view of the high degree of technical difficulty involved.

Forming the thicknesses wherewith coloring materials adhere evenly in order to minimize variation in color tone in even more minute pixels is a very important process in determining color filter quality, but such processes are not elucidated in the prior art.

There is also nothing elucidated in the prior art about techniques for forming adjacent red, green, and blue deployments in such minute pixels, simultaneously, and without ink color mixing.

The present invention, devised for the purpose of radically resolving such technical difficulties inherent in the prior art, provides a method wherewith inks, as the coloring material, can be efficiently deployed in light blocking material matrix gaps by the ink jet method. Not only so, but a method is provided wherewith, because the ink film thickness is made uniform and given high bonding properties, high-contrast color filters are manufactured without pixel flaws or color tone irregularities. Another object is to provide a manufacturing method for liquid crystal display devices wherein such color filters are incorporated.

Another object is to provide color filters that comprise both light blocking regions having adequate light blocking properties and transparent regions wherein there is no color mixing, together with a manufacturing method therefor.

Yet another object of the present invention is to provide electro-optical devices and electronic equipment having such color filters as those described in the foregoing.

DISCLOSURE OF THE INVENTION

The color filter of the present invention is a color filter that, inside the openings enclosed by the banks formed for demarcation on the substrate, comprises ink films (coloring layers) colored by inks. The banks have a structure wherein, from the substrate side, a metal film and a photosensitive organic thin film are laminated. Because of this laminar structure, not only can banks of sufficient height be formed, but treating the substrate surface for the inks (i.e. treating to give the banks ink repellency and give the substrate ink affinity) becomes easy.

The resist used for etching the metal film can be used as the photosensitive organic thin film. When that is done, the process of removing unneeded resist after etching the metal layer can be omitted, so that the color filter manufacturing process can be simplified.

The photosensitive organic thin film can be selected from among polyimide films, acrylic resin films, polyhydroxy styrene films, novolac resin films, polyvinyl alcohol films, and cald resin films. This photosensitive organic thin film can be given ink repellency by adding a fluorine-based surfactant thereto. The fluorine-based surfactant used is a structure having perfluoroalkyl or derivative thereof, fluorobenzene, difluorobenzene, trifluorobenzene, perfluorobenzene, or fluorophenol or derivative thereof as the fluorine-containing group. Ink repellency can also be imparted to the photosensitive organic thin film by mixing a fluorine-based polymer therein. This fluorine-based polymer can be selected from among silicone rubber, vinylidene polyfluorides, fluoroolefins, vinyl ether-based copolymers, ethylene trifluoride, vinylidene fluoride copolymers, polytetrafluoroethylenes, perfluoroethylene propyline resins, and perfluoroalcoxy resins. By adjusting the amount of such fluorine-based surfactant added or the fluorine-based polymer mixture ratio, the contact angle between the banks and the ink—that is, the ink repellency of the banks—can be adjusted according to necessity.

The photosensitive organic thin film can be configured by laminating a plurality of photosensitive organic thin films. The metal film can also be made to function as a black matrix. In that case, it is preferable that the composition of the metal film contain either chromium, nickel, tungsten, tantalum, copper, or aluminum.

In a color filter comprising a protective film that covers the banks and the ink films, furthermore, it is preferable that the composition of the protective film have bisphenol A or bisphenol fluorolene or the like in order to satisfy the demands for heat resistance, transparency, and leveling properties. What is even more preferable is to make the composition of the protective layer the same as the composition of the organic thin film, thus making it possible to prevent crawling or unevenness in the protective film formed on the banks, whereupon color filters for liquid crystal display elements can be provided which exhibit outstanding contrast.

In the substrate surface treatment, the combination of the banks and the ink should be set so that the contact angle between the banks and the ink is 30 degrees or more but 60 degrees or less. If this contact angle is less than 30 degrees, the affinity between the banks and the ink rises, the quantity of ink adhering to the banks becomes large, and it will become easy for coloring flaws to occur on the substrate. If the contact angle exceeds 60 degrees, on the other hand, the ink repellency of the bank relative to the ink becomes large, and it will become easy for coloring flaws to develop on the substrate near the banks. The contact angle between the substrate and the ink, meanwhile, should be 30 degrees or less. When consideration is given to the fact that ink affinity is desired in the substrate, and to the pixel pitch in the color filter, this is seen to be a suitable range.

The liquid crystal display element of the present invention comprises the color filter described in the foregoing. By comprising that color filter, very minute liquid crystal display elements can be provided which exhibit no display unevenness or coloring unevenness.

The color filter manufacturing method of the present invention is a method of manufacturing a color filter comprising ink films in the openings enclosed by banks formed for demarcation on the substrate, comprising a first step for demarcating and forming a metal film on the substrate, a second step for forming the banks by forming a photosensitive organic thin film on the metal film, and a third step for filing the interiors of the openings with ink to form ink films. By making the photosensitive organic thin film the resist for etching the metal film, the resist removal step can be omitted and the color filter manufacturing process simplified. The second step may form the banks by laminating a plurality of photosensitive organic thin films on the metal film. It is also permissible to provide, between the second and third steps, a step for imparting ink affinity to the substrate surface by implementing a plasma treatment using oxygen gas as the induction gas, and a step for imparting ink repellency to the banks by implementing a plasma treatment using a fluoride compound as the induction gas. By these plasma treatment steps, the banks can be made to exhibit ink repellency and the substrate to exhibit ink affinity. The fluoride compound used as the induction gas should be either carbon tetrafluoride gas, nitrogen trifluoride gas, or sulfur hexafluoride gas. The bank can also be made ink-repellent by heating the substrate instead of performing the plasma treatment using the fluoride compound as the induction gas.

The color filter manufacturing method of the present invention is also characterized in that it has a step for forming a metal thin film matrix pattern that is a light blocking layer on the transparent substrate, a step for forming matrix banks with resin on the metal thin film light blocking layer, and a step for directly applying ink in the gaps in that matrix pattern.

The liquid crystal display device manufacturing method of the present invention is characterized in that it has a step for forming a metal thin film matrix pattern that is a light blocking layer on the transparent substrate, a step for forming matrix banks with resin on that metal thin film light blocking layer so that they are roughly superimposed on the metal thin film matrix pattern, a step for subjecting the entire surface patterned as described above to a dry etching process, a step for providing ink in the gaps of that matrix, and an overcoat application step for smoothing the upper surface, and also a step for forming a color filter substrate that includes a step for forming thin film electrodes, a step for deploying an opposing substrate having pixel electrodes in opposition to the color filter substrate, and a step for filling the gap between the color filter substrate and the opposing substrate with a liquid crystal composition.

In the manufacturing method described in the foregoing, the step for forming the metal thin film light blocking layer matrix pattern on the transparent substrate comprises a step for patterning the metal thin film layer by a photoresist etching method.

Included in the manufacturing method described in the foregoing is the fact of being a process for patterning the photosensitive resin composition by a photoresist method with the banks that partition the gaps to which the inks are deployed superimposed on the metal thin film matrix pattern on the transparent substrate.

In the manufacturing method described in the foregoing, the step for obtaining a contact angle difference of 15° or more between the surface of the resin banks described above and water on the surface in the gaps in the transparent substrate partitioned by those banks comprises a step for performing simultaneous entire-surface dry etching on the resin surface and substrate gap.

In the manufacturing method described in the foregoing, the step for providing ink in the resin matrix pattern gaps comprises a step for effecting the controlled provision of minute ink drops, from 6 picoliters to 30 picoliters each, by an ink jet printing head.

The manufacturing method described in the foregoing includes the fact that the inks include a solvent having a high boiling point of from 150 to 300° C., and are thermally hardened inks the compositions whereof are adjusted, by suitably establishing the drying conditions to settings in a natural atmosphere, 40 to 100° C. prebaking, and 160 to 240° C. final baking, so that the ink layer films on the surfaces in the substrate gaps after application and drying are leveled and the film thickness is made uniform.

In manufacturing color filters, by forming a light blocking layer matrix pattern on a transparent substrate, and providing red, green, and blue coloring materials or inks of the necessary color tones in the gaps in that matrix pattern so that there is no intermingling of colors, color filters of outstandingly high contrast can be obtained. When this is being done, a resin matrix pattern for demarcating the gaps in the matrix pattern noted above is formed so that it is superimposed on the light blocking layer matrix pattern in order to prevent ink color mixing. Forming this matrix pattern made up of two layers and activating the surface to adjust the ink adhesion conditions prior to deploying the inks constitute one fundamental technology for manufacturing color filters.

In the present invention, a metal thin film is employed as the first layer light blocking layer in the matrix pattern made up of two layers as described above, and a matrix pattern is obtained by forming that film to a thickness of 0.1 to 0.5μ and employing a photoresist etching method. This thin film metal can be obtained using a technique such as vapor deposition, sputtering, or chemical vapor deposition. A photosensitive composition is employed for the second layer, a pattern which is superimposed on the first layer is formed to a layer thickness of 1.5 to 5μ, and patterning is done, again employing a photoresist method. The photosensitive composition employed in the second layer need not be black in color, and liberal use can be made of the generally available photosensitive compositions. The substrate gap surfaces wherein the second layer is patterned is exposed to all kinds of contaminating factors during the patterning process, whereupon the contact angle with water rises, constituting an impairment later when deploying the inks and forming uniform films. For that reason, after patterning, as a step preparatory to deploying the inks, the entire surface is subjected to a dry etching operation. At that time, it is only necessary to realize conditions such that the contact angle of the pattern gaps with water is restored to the initial transparent substrate value, and there is no need whatever to selectively etch only the gaps. According to what has been learned, a difference of 15° or more in the contact angle for water between the gap surfaces and the second layer material resin surface can be obtained by a dry etching method such as UV irradiation, plasma irradiation, or laser irradiation.

In the present invention, furthermore, focusing attention on the step for deploying inks to the matrix pattern gap surfaces, technology is perfected for accurately providing small ink drops of 6 to 30 picoliters each, while controlling the number of drops, in minute pixel demarcations that are 50μ square. In order to secure film thickness uniformity in the ink coating films provided in the gap demarcations in the matrix pattern, a solvent having a high boiling point is added to the ink composition, thereby making it possible to improve ink leveling properties, with significant effectiveness realized with a solvent having a boiling point of 150 to 300° C. The means used together with the addition of the high-boiling-point solvent for securing film thickness uniformity in the ink coating films are controlling the drying conditions after providing the ink, with it being appropriate to cause drying and hardening in the three steps of setting in a natural atmosphere, prebaking in a middle temperature range at 40 to 100° C., and final baking at 160 to 240° C.

The present invention also comprises the suppression of variation in the color tones of the thermally hardened ink coating films provided in the gaps of the matrix pattern, limiting that variation to a certain range. The regions where color tone variation must be considered are regions within the same pixel, within the same chip, and within the same substrate. In every one of these regions the color difference that is the variation index can be held down to 3 or below.

In the color filters of the present invention, furthermore, light blocking regions and light transmitting regions are deployed in a prescribed matrix pattern on a transparent substrate, with the light blocking regions comprising a light blocking layer and a bank layer provided on that light blocking layer, and the light transmitting regions configured by a coloring layers demarcated by the light blocking regions. In the bank layer, the peripheral edges of the bottom surface thereof are positioned inside the peripheral edges of the light blocking layer. The light blocking layer has an exposed surface on the upper surface thereof whereon the bank layer is not superimposed. The coloring layer is formed so that the peripheral edges thereof are not superimposed on the exposed surface of the light blocking layer.

In this color filter, the bank layer has the peripheral edges of the bottom surface thereof positioned inside the peripheral edges of the light blocking layer. That is, in the plan-view pattern, part of the light blocking layer is exposed, formed so that the width thereof is smaller than the light blocking layer. By having this exposed surface, non-transmitting portions are formed at the peripheral edges of the coloring layer where it is difficult to obtain uniform film thickness, which non-transmitting portions function as light transmitting regions. As a result, in the color filters of the present invention, the film thickness of the light transmitting portions of the coloring layer that function as light transmitting regions can be made uniform, so that such flaws as color tone irregularities do not tend to occur, and high contrast is effected.

Furthermore, by providing the light blocking layer and the bank layer, the light blocking function and the demarcation function of the coloring layer can each be provided independently, so that both functions can be manifested without fail. As a result, in the color filters of the present invention, pixel flaws caused by inadequate light blocking or color mixing of the color materials configuring the coloring layer do not tend to arise. Furthermore, by dividing the functions in this manner, ideal materials for configuring the light blocking layer and the bank layer can be selected from a wide range, and this is a benefit also in terms of production costs.

With the color filters of the present invention, moreover, in the bank layer, the peripheral edges of the bottom surface thereof are positioned inside the peripheral edges of the light blocking layer. In other words, the side surfaces of the bank layer are drawn back farther than the side surfaces of the light blocking layer, wherefore a step is formed on the light blocking layer. The inks that constitute the color materials can be held by this step, wherefore, even if some of the ink layers overflow the bank layer while forming the coloring layer, that ink is prevented from flowing onto the exposed surface of the substrate in adjacent coloring layer formation regions. For that reason, color mixing in the coloring layer caused by ink mixing can be prevented from occurring. As a result, flaws such as color tone irregularities do not tend to develop in the color filters of the present invention, and high contrast is effected.

It is preferable that the color filters of the present invention take the following modes.

It is preferable that the exposed surface of the light blocking layer described earlier be continuous around the periphery of the light transmitting region. By this exposed surface being continuous, the operating effects of the color filters described earlier can be elicited more definitely. The width of that exposed surface of the light blocking layer should be from 3 to 10µ in view of the non-uniformity of the film thickness of the coloring layer about the peripheral edges thereof.

It is preferable that the light blocking layer be configured of a metal layer. When the light blocking layer is configured of a metal layer, light blocking performance that is both even and adequate can be obtained with small film thickness. In the interest of light blocking performance and film formation performance, the thickness of the metal layer configuring the light blocking layer should be from 0.1 to 0.5µ.

The film thickness of the bank layer should be from 1 to 5µ in view of the fact that the ink layers are held so that the ink deployed in the coloring layer formation regions does not overflow when forming the coloring layer.

The cross-sectional shape of the bank layer in the width dimension may be roughly trapezoidal with the width wider on the substrate side. With the bank layer having such a structure as this, the uniformity of the coloring layer can be enhanced even further without sacrificing the effective surface area of the coloring layer.

Based on the color filters of the present invention, colored light transmitting regions of even film thickness can be obtained, and those light transmitting regions can manifest good optical characteristics, with the variation in color tone in the same pixel, in the same chip, and in the same substrate held down preferably to a color difference of 3 or less, and even more preferably to a color difference of 2 or less.

The color filter manufacturing method of the present invention comprises the following steps (a) to (c):

(a) a step for forming a light blocking layer having a prescribed matrix pattern on a transparent substrate;

(b) a step for forming a bank layer having a prescribed matrix pattern on the light blocking layer, wherewith the peripheral edges of the bottom surface of the bank layer are positioned inside the outer edges of the light blocking layer, and some of the upper surface of that light blocking layer is formed in an exposed condition; and (c) a step for forming coloring layers in coloring region formation regions demarcated by the light blocking layer and the bank layer, wherewith the coloring layers are formed on the substrate, and the peripheral edges thereof are formed in a condition wherein they are superimposed on the exposed surface on the upper surface of the light blocking layer.

Based on this color filter manufacturing method, the color filters of the present invention described earlier can be obtained by simple steps. Also, the red, green, and blue colored color materials (inks) can be deployed in the coloring layer formation regions by the bank layer in a condition wherein there is no color mixing, whereupon it is possible to obtain high-contrast color filters exhibiting no flaws such as color tone irregularities.

In addition, the peripheral edges of the bottom surface of the bank layer are positioned inside from the peripheral edges of the light blocking layer. That is, the side surfaces of the bank layer are farther withdrawn than the side surfaces of the light blocking layer, wherefore a step is formed on the light blocking layer. As described already, the occurrence of color mixing in the coloring layer due to ink mixing can be prevented by that step. As a consequence, based on the color filter manufacturing method of the present invention, high-contrast color filters can be obtained wherein flaws such as color tone irregularities do not tend to occur.

In step (a) above, the light blocking layer should be formed by first forming the metal layer on the substrate, and then patterning that metal layer by photolithography and etching. The advantages of using a metal layer for the light blocking layer were noted earlier and so are not further described here. This metal layer can be formed by a method such as vapor deposition, sputtering, or chemical vapor deposition.

In step (b) above, the bank layer should be formed by first forming a photosensitive resin layer on the substrate whereon the light blocking layer has been formed, and then patterning by photolithography. This bank layer need not be light blocking, and so need not be black, so that it is possible to select broadly from among the commonly available photosensitive resin compositions.

It is preferable that the entire surface of the substrate whereon light blocking regions have been formed be subjected to a surface treatment prior to the process of forming the coloring layer in step (c) above. By this surface treatment, the difference in the contact angle for water between the bank layer surface and the substrate surface should be made 15° or greater. Thus, by subjecting the substrate surface to a surface treatment prior to forming the coloring layer, contaminating substances adhering to the exposed surface in the coloring layer formation regions on the substrate are removed, whereupon it is possible to make the contact angle of that exposed surface with water small and to enhance ink wettability.

In other words, by controlling the contact angle with water of the exposed surface of the substrate and the bank layer, ink can be deployed in a condition wherein it adheres well to the exposed surface in the coloring layer formation region, and the ink is prevented from crossing over the bank layer and overflowing by the ink repelling property of the bank layer. The method used for this surface treatment can be ultraviolet irradiation, plasma irradiation, laser irradiation, or dry etching involving an etching gas.

In step (c) above, for the coloring layer, it is preferable that the coloring layer formation regions be provided with inks using an ink jet printing head. By using that method, the color filters of the present invention can be formed simply and with few steps. That is, by forming the coloring layers with the ink jet method, the step of using photolithography to perform patterning can be eliminated, so the steps can be simplified. Also, because inks are deployed in the coloring layer formation regions by the ink jet method, inks can be deployed only in the regions where they are needed. For that reason, there is no loss of color materials as occurs when unneeded portions are removed in patterning by photolithography, so the color filter manufacturing costs can be reduced.

With the ink jet method, the ink should be delivered in minute ink drops of from 6 to 30 picoliters each. By controlling the number of these minute ink drops, inks can be exactingly deployed in minute regions of from 40 to 100μ square, for example.

In step (c) above, it is preferable that the ink forming the coloring layer contain a solvent having a boiling point of from 150 to 300° C. By adding a solvent with a high boiling point to the ink, the ink drying speed can be decelerated. As a result, the ink leveling properties can be improved and the film thickness of the coloring layer made more uniform. For this solvent of high boiling point, at least one type of solvent can be used that is selected from among butylbarbitol acetate, methoxybutyl acetate, ethoxyethyl propionate, and methoxy-2-propyl acetate. But this poses no limitation, and the solvent can be selected from a wide range of solvents having a boiling point of from 150 to 300° C., taking pigment diffusability or dye solubility into consideration.

In step (c) above, it is preferable that the inks used for forming the coloring layers, after being deployed in the coloring layer forming regions, be subjected to a combination, depending on the ink properties, of at least either setting in a natural atmosphere or prebaking at 40 to 100° C., and final baking at 160 to 300° C. By selecting that combination and the ink drying conditions while taking the control of the ink drying speed discussed earlier into consideration, even greater film thickness uniformity can be definitely realized in the coloring layers.

The electro-optical device relating to the present invention comprises one of the color filters described in the foregoing, an opposing substrate deployed at a prescribed interval with that color filter, and an electro-optical material layer deployed between that color filter and that opposing plate.

The electronic equipment relating to the present invention comprises the electro-optical device of the present invention.

Based on the electro-optical device and electronic equipment relating to the present invention, costs can be reduced, as with the operating effects of the color filters of the present invention described earlier, and high-contrast displays can be effected with no pixel flaws such as color tone irregularities. If a liquid crystal material layer is used for the electro-optical material layer noted earlier, moreover, liquid crystal display devices can be configured that can produce high-contrast displays with no pixel flaws such as color tone irregularities.

Figure 1:
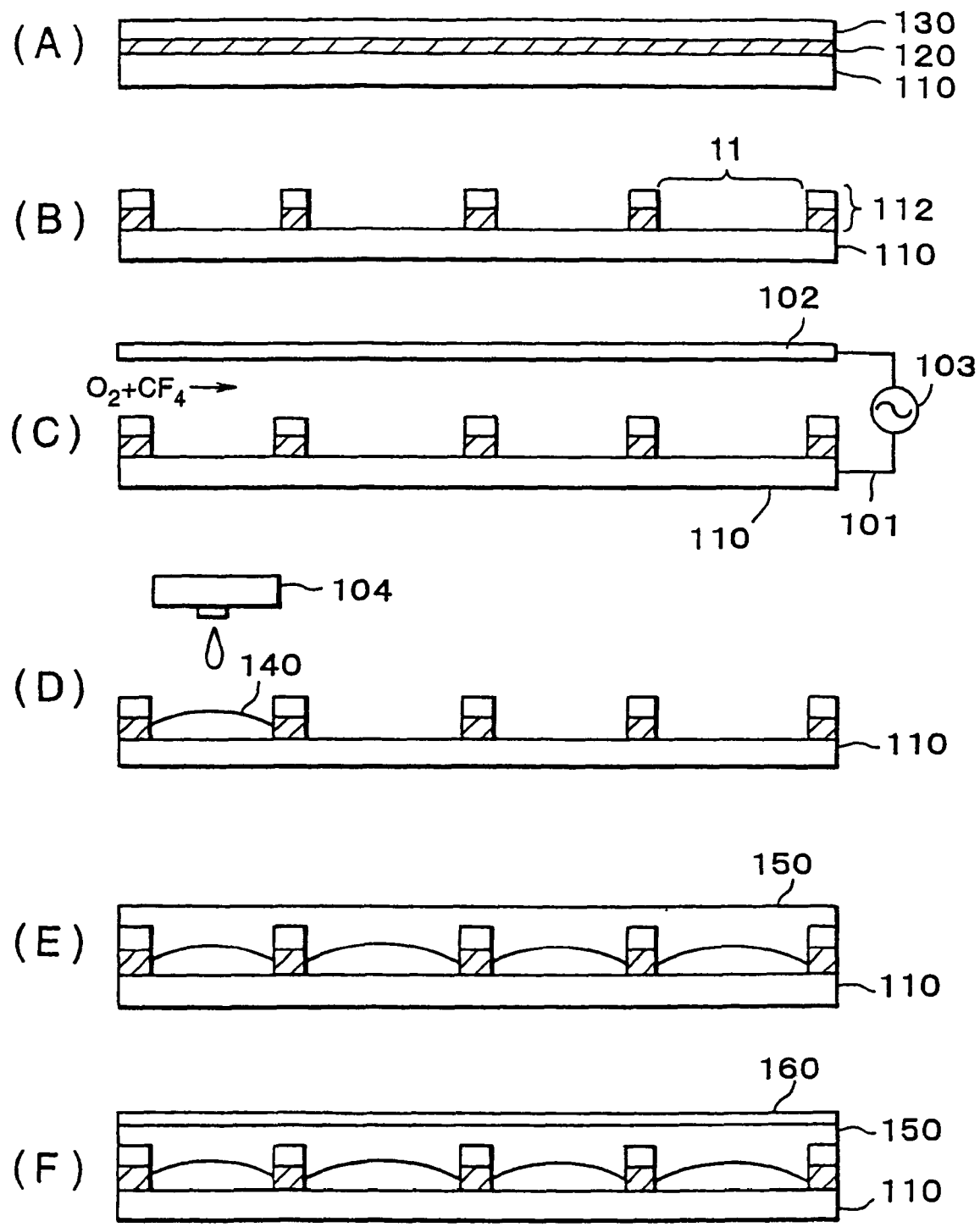
FIG. 1 is a cross-sectional manufacturing process diagram for a color filter according to a first embodiment of the present invention.

In the drawings, item 110 is a substrate, 120 is a chromium film, 130 is a resist, 140 is ink, 150 is a protective film, 160 is a transparent electrode, 101 is an electrode, 102 is an electrode, 103 is a power supply, and 104 is an ink jet type recording head.

Item 201, furthermore, is a transparent substrate, 202 is a thin film metal layer, 203 is a mask, 204 is a photosensitive resin composition 1, 205 is a photosensitive resin composition 2, 206 is ink, 207 is an overcoat resin, 209 is a color filter, 210 is a common electrode, 211 is an orientation film, 212 is an liquid crystal composition, 213 is a pixel electrode, 214 is a glass substrate, 215 is a polarization panel, 216 is light from a back light, 217 is a pixel ink cross-section immediately after deployment, 218 is a pixel ink cross-section after prebaking, 219 is a final ink cross-section when the drying conditions are appropriate, 220 is a final ink cross-section that has become convex when the drying conditions are not appropriate; and 221 is a final ink cross-section that has become convex when the drying conditions are not appropriate.

Item 310, furthermore, is a substrate, 320 is a light blocking region, 322 is a light blocking layer, 324 is a bank layer, 330 is a light-transmitting region, 332 is a coloring layer, 332a is a light-transmitting part, 332b is a non-transmitting part, 340 is an overcoat layer, 350 is a common electrode, 352 is a pixel electrode, 360 and 362 are orienting films, 370 is a liquid crystal layer, 380 is a substrate, 390 and 392 are polarization panels, 300 is a color filter, 1000 is a liquid crystal display device, 2000 is a digital still camera, and 3000 is a personal computer.

BEST MODE FOR CARRYING OUT THE INVENTION

EMBODIMENT 1

A color filter manufacturing process is now described with reference to FIG. 1.

Thin Film Forming Step (FIG. 1(A))

This step is a step for forming a chromium film 120 and a resist 130 on a substrate 110. The material used for the substrate 110 can be a glass substrate, plastic film, or plastic sheet, etc. For the substrate 110, a flat transparent glass substrate is prepared, measuring approximately 370 mm×470 mm×1.1 mm, for example. This transparent glass substrate should be able to withstand heat to a temperature of 350° C., be highly resistant to such chemicals as acids and alkalis, and be capable of mass production. Argon gas is used in sputtering a chromium target to form the chromium film 120 on the substrate 110. The film thickness is made 0.15μ. This chromium film 120 is patterned in prescribed demarcation regions in a step described subsequently, and functions as a black matrix comprising openings in the pixel regions. Next, a positive type photosensitive resist 130 is spin-coated onto the chromium film 120. The film thickness of this resist 130 is made 2.5μ. In addition to chromium, either nickel, tungsten, tantalum, copper, or aluminum may be used for the black matrix material.

Etching Step (FIG. 1(B))

This step is a step for etching the chromium film 120, using the resist 130 as a mask, to form banks 112. After applying the photosensitive resist 130, the entire surface is subjected to a one-shot exposure in a prescribed demarcation pattern and developed. Next, the chromium film 120 is etched with an aqueous solution of ammonium cerium nitrate and perchlorate, using the resist 130 as a mask, to form openings 111. The pattern in which these openings 111 are formed may be suitably selected from among a mosaic arrangement, delta arrangement, or striped arrangement, etc. The shapes of the openings are not limited to rectangular, but may be circular to match the shape of the ink drops. By this step, the banks 112 are formed (to a film thickness of 2.65μ), made up of the chromium film 120 and the resist 130. These banks 112 function as partitioning members for the openings 111.

In the step described above, furthermore, the resist pattern obtained by developing the resist 130 is separated from the chromium film 120 with a chemical treatment or an ashing treatment using oxygen plasma or the like, and the demarcation-formed chromium pattern is exposed to the substrate surface. A resist or polyimide may be applied to that chromium pattern, and patterned in a photolithograpic process so that it is superimposed on the chromium pattern to form the banks 112.

Surface Treatment Step (FIG. 1(C))

This step subjects the substrate surface to a plasma treatment, and thereby imparts ink affinity to the substrate 110 and ink repellency to the banks 112. The upper part (resist 130) of the banks 112 is configured of an insulative organic material, and the substrate 110 is configured of an inorganic material such as glass, wherefore the effect described above is obtained by subjecting the substrate surface to a plasma treatment using a gas containing a fluorine-based compound as the induction gas. More specifically, with a capacitive coupling type plasma treatment, the induction gas is made to flow to a reaction chamber, one electrode 101 is connected to the substrate 110, another electrode 102 is made to oppose the surface of the substrate 110, and a voltage is applied from a power supply 103.

First, a plasma treatment is performed for 10 to 300 seconds, using oxygen ($O_2$) as the induction gas, under conditions of a gas flow volume of 500 SCCM, power of 0.1 W/cm$^2$ to 1.0 W/cm$^2$, and pressure of 1 Torr or less. With this step an ashing treatment is performed for the openings 111, with ink affinity realized by the substrate 110 exposed to the surface being activated.

Next, a plasma treatment is performed for 600 to 3600 seconds, using carbon tetrafluoride ($CF_4$) as the induction gas, under conditions of a gas flow volume of 900 SCCM, power of 0.1 W/cm$^2$ to 1.0 W/cm$^2$, and pressure of 1 Torr or less. By this step, the surface energy of the banks 112 can be lowered, making it easy to repel ink. Accordingly, the banks 112 can be made semi-permanently ink-repellent while keeping the ink affinity of the surface of the substrate 110.

Moreover, when conducting the plasma treatment with the fluorine-based compound gas, nitrogen trifluoride ($NF_3$) or sulfur hexafluoride ($SF_6$) or the like can be used instead of carbon tetrafluoride ($CF_4$). It is also possible to use a heat treatment to restore the banks 112, after once being activated with the oxygen plasma, to their original ink repellency.

The substrate surface can be modified by the surface treatments described in the foregoing, but it is particularly desirable that the contact angle between the inks and the banks 112 be set from 30 degrees to 60 degrees, and that the contact angle between the inks and the substrate 110 be set to 30 degrees or less.

The preferred range for the contact angle between the inks and the banks 112 can be derived as a result of the tests described below. In these tests, the film thickness conditions of ink films are measured with the contact angle between the ink and the glass substrate at 15 degrees, and the contact angle between the banks and the inks set at 15 degrees, 33 degrees, and 64 degrees (respectively). The results of these tests are diagrammed in FIG. 3. In this figure, the symbol 105 represents the film thickness of the bank BM and the ink film IL, while the symbol 106 indicates a bottom line indicating the ideal film thickness for the ink film IL.

Figure 3:
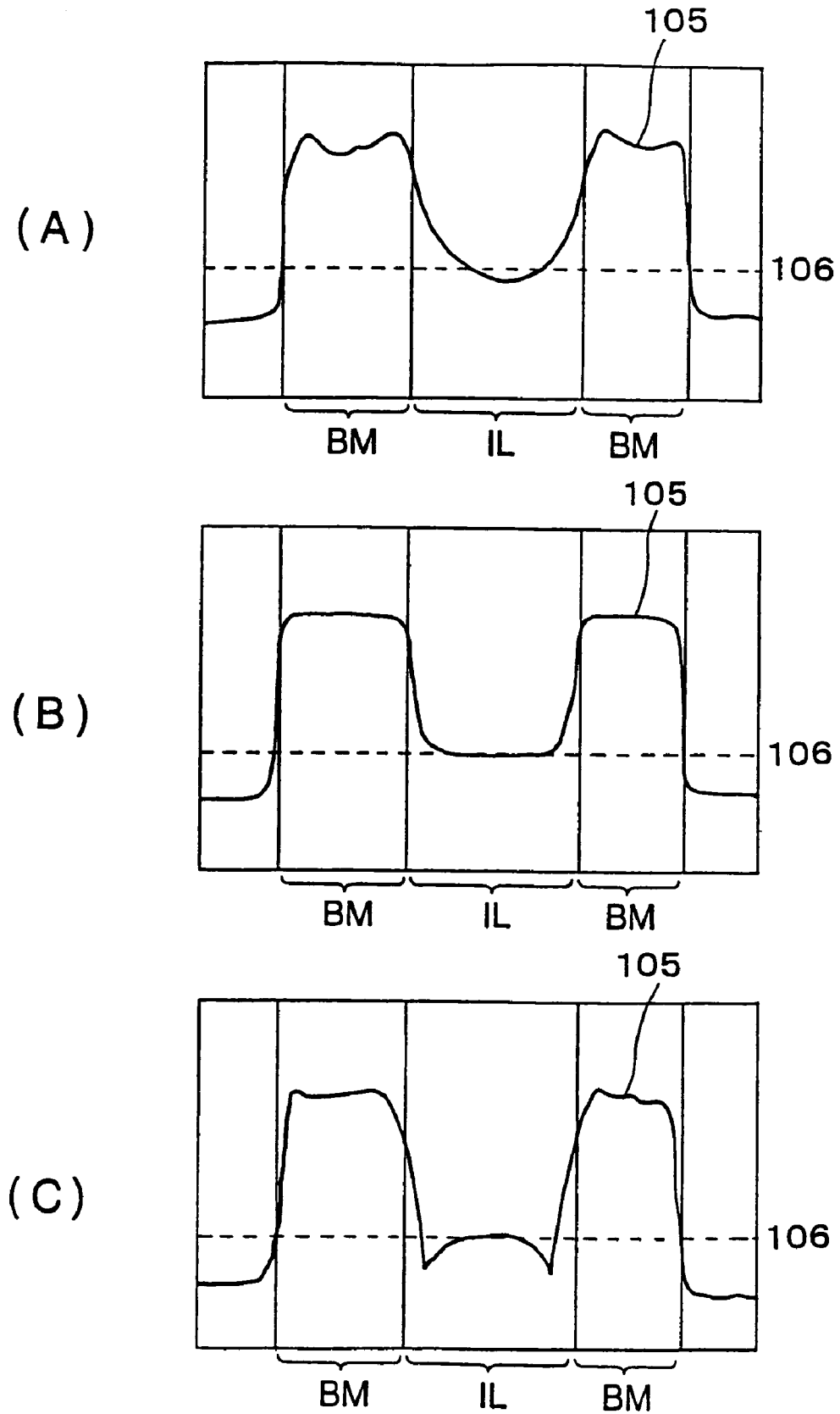
FIG. 3 is a diagram representing ink film coloring conditions.

At (A) in FIG. 3 is represented the case where the contact angle between the ink and the banks BM is 15 degrees. Here it can be confirmed that the film thickness is inadequate in the center part of the ink film IL. For that reason, color loss occurs in the center part of the ink film IL. The reason for this is thought to be that the quantity of ink adhering to the banks BM is great because the affinity between the ink and the banks BM is high, whereupon ink does not spread adequately inside the opening. It is undesirable that the coloring by the ink be in this condition because that will become a cause of reducing the contrast in the liquid crystal display device.

At (B) in FIG. 3 is represented the case where the contact angle between the ink and the banks BM is 33 degrees. Here it can be confirmed that the ink spreads throughout the opening, and that color loss does not occur. This is thought to be because coloring irregularities do not arise because of the good balance between the ink repellency between the ink and the banks BM, on the one hand, and the ink affinity between the ink and the substrate, on the other.

At (C) in FIG. 3 is represented the case where the contact angle between the inks and the banks BM is 64 degrees. Here it can be confirmed that color loss occurs in the ink film IL in the vicinity of the banks BM. This is thought to happen because color loss occurs in the ink film IL in the vicinity of the banks BM due to the high ink repellency of the banks BM. In view of these results, it is believed that the contact angle between the inks and the banks should be set at from 30 degrees to 60 degrees.

Figure 4:
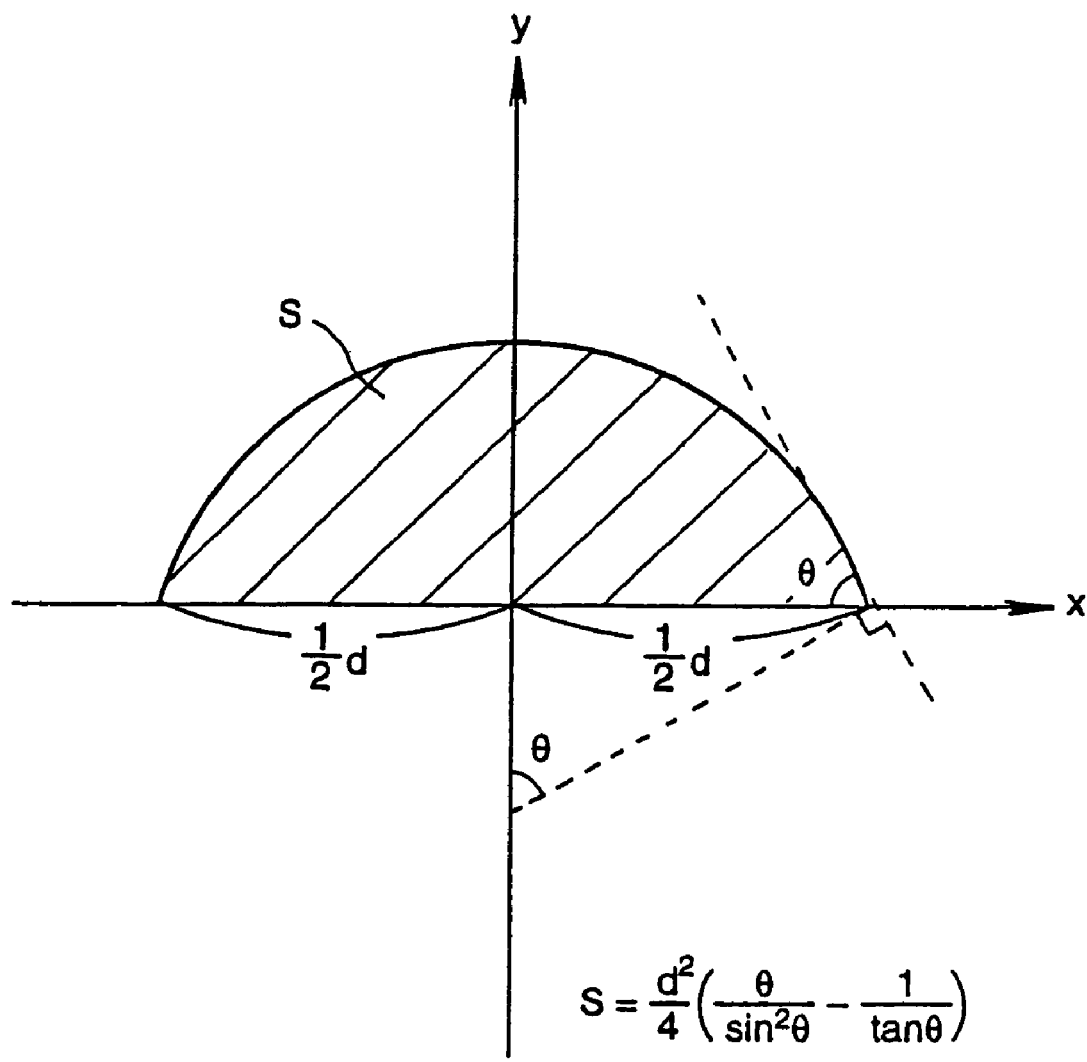
FIG. 4 is a diagram of the relationship between surface area and the angle wherewith ink drops discharged on a substrate contact a glass substrate.

The preferred range for the contact angle between the inks and the substrate 110 can be derived as a result of the following reasoning. FIG. 4 is a diagram for finding the surface area S of an ink drop formed under the conditions of a contact angle θ between the substrate and the ink and a contact width d between the substrate and the ink. From this diagram, the surface area S can be derived by drawing the area of the right triangle from the area of the fan shape. This surface area S may be calculated as follows.

$$S = \frac{d^2}{4}\left(\frac{\theta}{\sin^2\theta} - \frac{1}{\tan\theta}\right)$$

Figure 5:
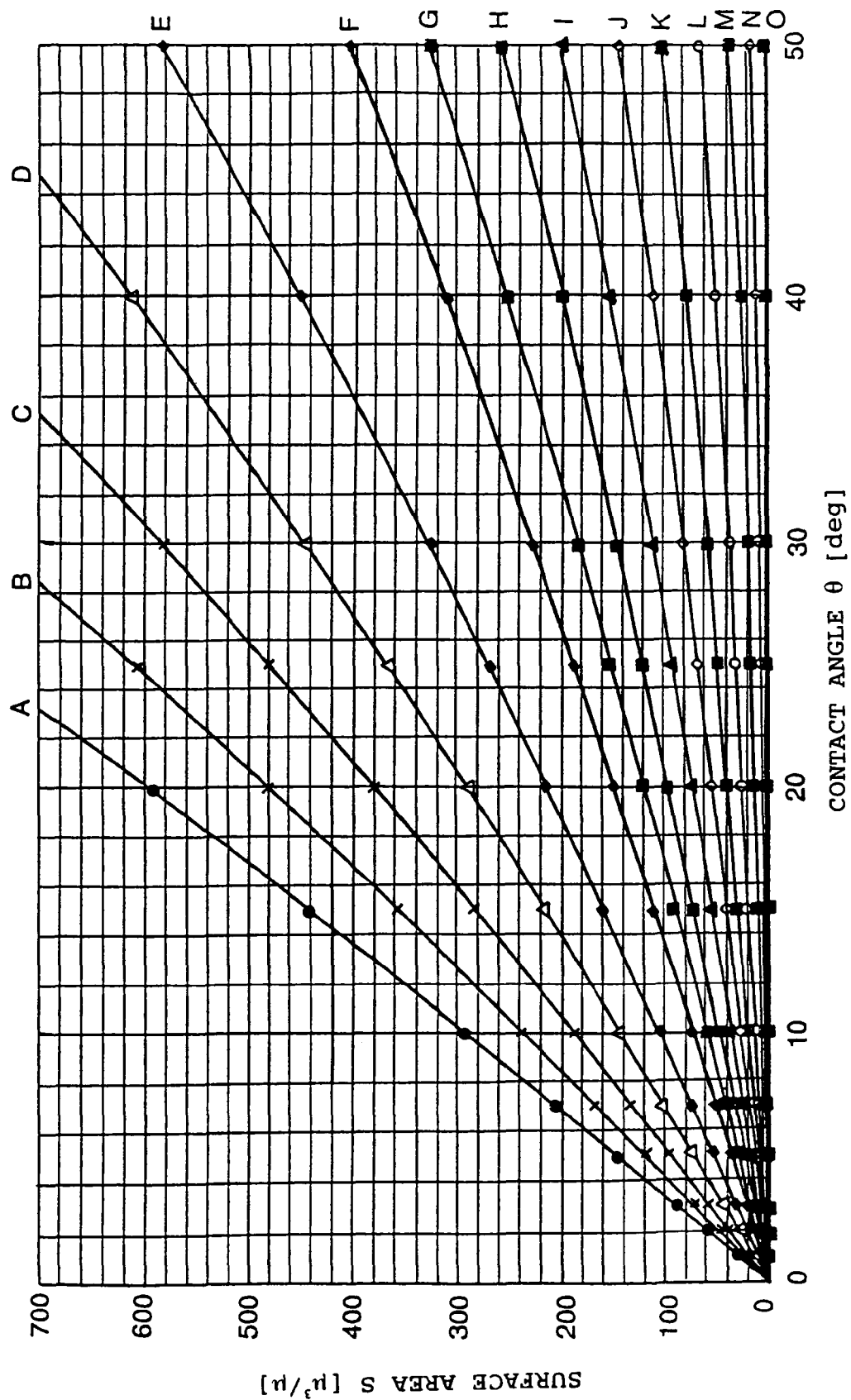
FIG. 5 is a diagram representing the relationship between surface area and the ink contact angle with a substrate when the contact width relative to the substrate is held constant.

In FIG. 5 is diagrammed the relationship between the contact angle θ (degrees) of the ink to the substrate and the surface area S ($\mu^3/\mu$) of an ink drop when the value of d in the formula above is varied within a range of 5μ to 100μ. In FIG. 5, the symbol A represents the case where d=100μ, B the case where d=90μ, C the case where d=80μ, D the case where d=70μ, E the case where d=60μ, F the case where d=50μ, G the case where d=45μ, H the case where d=40μ, I the case where d=35μ, J the case where d=30μ, K the case where d=25μ, L the case where d=20μ, M the case where d=15μ, N the case where d=10μ, and O the case where d=5μ.

When the ink drops discharged from the ink jet printing head (Epson MJ-500C) measure 571μ³ per drop and the pixel region pitch in the color filter is 80μ, the contact angle with the substrate will be seen to be 28 degrees from FIG. 5. Because ink affinity is desired between the substrate and the inks, the contact angle between the inks and the substrate should be set at 30 degrees or less.

Furthermore, in order to establish the contact angle between the inks and the banks within the range noted above, it is well to add a fluorine-based surfactant to the resist 130 such, for example, as one with a structure having a fluorine-containing group such as perfluoroalkyl and its derivatives, fluorobenzene, difluorobenzene, trifluorobenzene, perfluorobenzene, or fluorophenol and its derivatives. By adding that fluorine-based surfactant to the resist 130, the surface energy of the resist 130 can be lowered so that ink is more readily repelled. The inventors were able to verify as a result of testing that resists 130 to which these surfactants were added functioned adequately as resist films (in terms of resistance to etching and bondability with the chromium film 120). By suitably adjusting the amounts of these surfactants added, the contact angle between the banks and the inks can be set within a range of 20 degrees to 60 degrees.

For the resist 130, moreover, a resist that is blended with a fluorine-based polymer such, for example, as a silicone rubber, vinyl polyfluoride, fluoroolefin, vinyl-ether-based copolymer, ethylene trifluoride, vinylidene fluoride copolymer, polytetrafluoroethylene, perfluoroethylene propylene resin, or perfluoroalcoxy resin. By blending the fluorine-based polymer into the resist 130, the surface energy of the resist 130 can be lowered so that ink is more readily repelled. The inventors were able to verify as a result of testing that resists 130 to which these polymers were blended functioned adequately as resist films (in terms of resistance to etching and bondability with the chromium film 120). By suitably adjusting the ratios in which these polymers are added, the contact angle between the banks and the ink can be set within a range of 2 degrees to 57 degrees. These contact angles are the values when the coefficient of viscosity of the ink is η=4.30 cPs and the surface tension thereof is γ=29.3 mN/m.

Ink Filling Step (FIG. 1.(D))

This step is a step for blowing ink into the openings 111 by the ink jet method and coloring the pixels R, G, and B. A pressurizing chamber in the ink jet printing head 104 is filled with ink, the pressure in the pressurizing chamber is increased by the drive of an actuator such as a piezoelectric thin film device or the like, and ink drops 140 are discharged. Because the upper part of the banks 112 is treated for ink repellency, the ink can be prevented from crossing over the banks 112 and flowing into the neighboring openings 111 and from running. The height of the banks 112 may be determined in view of the ink volume required for coloring, and can easily be adjusted by the thickness of the resist 130.

After the ink drops are loaded in the openings 111, a heat treatment is administered with a heater. This heating is done at a temperature of 110° C., for example, to vaporize the solvent in the ink. When this process is done, only the solid components in the ink remain, and a film is formed. Thus a component can be added to the ink so that it is either hardened by heating, considering the steps subsequent to coloring, or, alternatively, so that it is hardened by the energy of ultraviolet radiation or the like. The component used for hardening by heating may be any of various thermally hardening resins. The component used for hardening by energy may be an acrylate derivative or methacrylate derivative to which a photoreaction starting agent has been added, or the like. Taking heat resistance into consideration, a component having multiple acryloyl groups or methacryloyl groups in the molecule is preferable.

Protective Film Forming Step (FIG. 1(D))

This step is a step for forming a protective film so that it will cover the ink films. After forming the ink films, heating is performed for a prescribed time (30 minutes, for example) at a prescribed temperature (200° C., for example) in order to completely dry the ink drops. When this drying is complete, the protective film 150 is formed on the color filter substrate on which the ink films have been formed. This protective film 150 also serves to smooth the surface of the filter. A method such as spin coating, roller coating, or dip coating, etc., is used in forming the protective film 150. In terms of the composition of the protective film 150, use may be made of a photo-hardening resin, thermally hardening resin, combination photo-thermally hardening resin, or an inorganic material or the like formed by vapor deposition or sputtering, etc. Taking transparency when used as a color filter into account, these materials can be used so long as they can withstand the subsequent ITO formation process and orientation film formation process, etc. If the protective film 150 is applied by spin coating, it is then heated for a prescribed time (60 minutes, for example) at a prescribed temperature (220° C., for example, to dry it.

Furthermore, by making the composition of the protective film 150 and the composition of the resist 130 the same, the formation of crawling and irregularities in the protective film 150 formed on the banks 112 can be prevented. In that case, AHPA (bisphenol A) or FHPA (bisphenol fluorolene) and the like can be used as the material of the protective film 150. In order to form the protective film 150 of these materials, first the substrate 110 is subjected to purification washing, and an amino silane treatment is done, after which the AHPA etc. is spin-coated onto the substrate surface. Next, the processes of prebaking (10 minutes at 80° C.), leveling (10 minutes at 150° C.), and postbaking (60 minutes at 200° C.) are performed and the protective film 150 is formed.

Transparent Electrode Formation Step (FIG. 1(F))

Next, using a commonly known procedure such as sputtering or vapor deposition, the transparent electrode 160 is formed over the entire surface of the protective film 150. As to the composition of this transparent electrode 160, a material may be used such as ITO (indium thin oxide) or a composite oxide of indium oxide and zinc oxide or the like which combines both light transmissivity and electrical conductivity.

The color filter substrate can be fabricated by undergoing the steps described in the foregoing. A color liquid crystal panel is generally fabricated by placing a color filter substrate and an opposing substrate together in opposition, and sealing a liquid crystal compound between the two substrates. On the inner side of the opposing substrate in the liquid crystal panel are formed thin film transistors and pixel electrodes in a matrix pattern. In addition, an orienting film is formed inside the surfaces of the two substrates, and, by subjecting that to a rubbing treatment, the liquid crystal molecules can be arranged in a certain direction. A polarizing panel is bonded to the outside of the respective glass substrates, and the liquid crystal compound is filled into the gap between these glass substrates. For the back light, a combination of a fluorescent bulb and a scattering plate is commonly used, and color displays are effected by causing the liquid crystal compound to function as an optical shutter that varies the transmissivity of the light from the back light.

It is also possible to apply this first embodiment to a manufacturing process for electroluminescence devices. More specifically, when using an ink jet method for coloring thin film materials that configure a hole transport layer, light emission layer, and electron transport layer, etc., in pixel regions enclosed by banks, the substrate surface design processes (i.e. the processes of imparting ink repellency to the banks and ink affinity to the substrate) are made easier when the bank structure is made the structure described in the foregoing.

As based on this first embodiment, the banks are given a two-layer structure comprising a chromium film and a resist, wherefore the substrate surface design processes are made easy. Because the resist used in the process of etching the chromium film is not removed but rather left as is when forming the banks, the manufacturing processes can be simplified.

(Modification 1)

Figure 2:
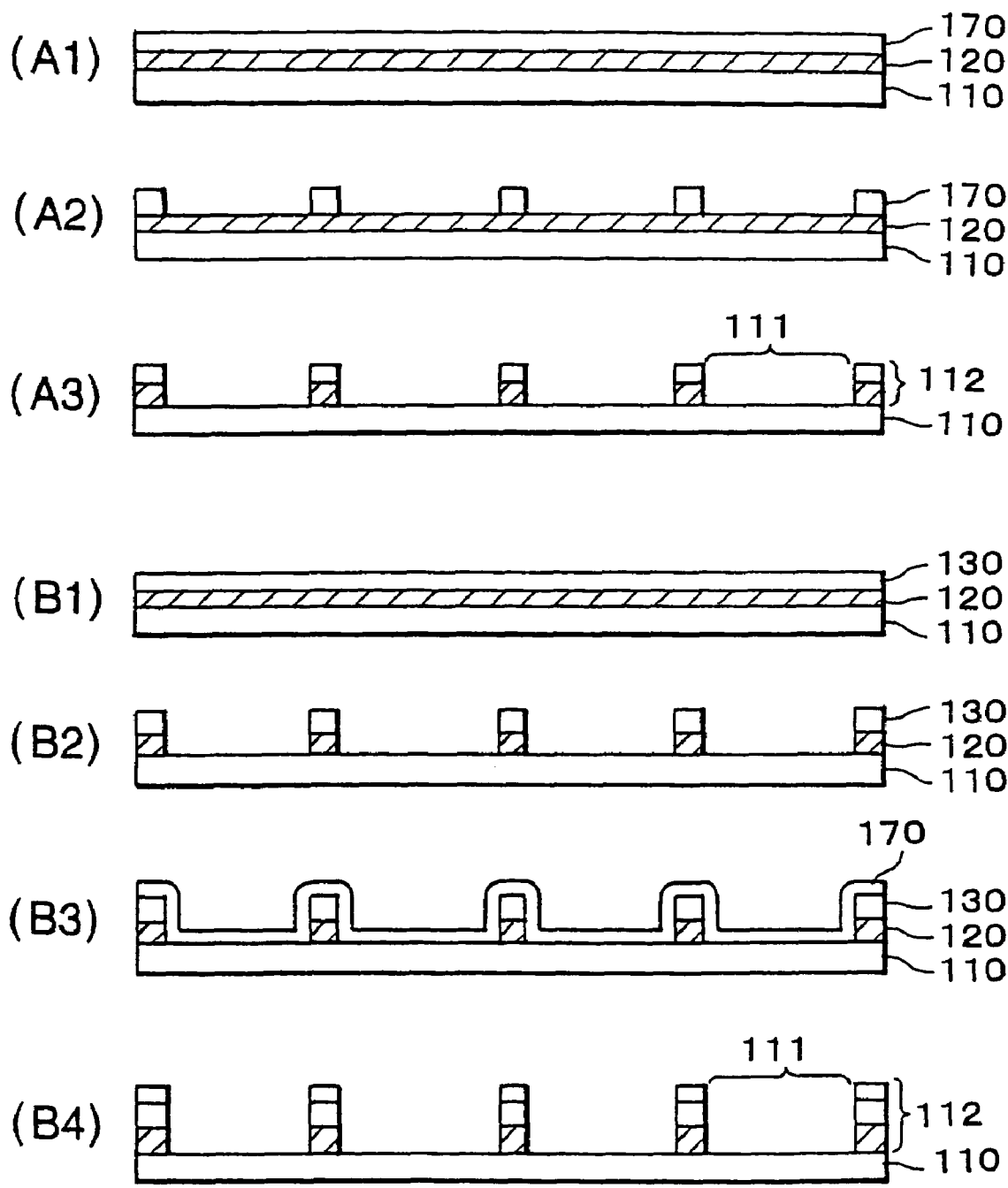
FIG. 2 is a cross-sectional manufacturing process diagram for a color filter according to a modification of the first embodiment.

The manufacturing process for a color filter according to a first modification of the first embodiment is now described with reference to FIG. 2 (A1 to A3). What is different in this modification from the color filter described above is that the banks 112 are given a structure wherein a photosensitive polyimide film 170 and chromium film 120 are laminated. First, the chromium film 120 is formed to a film thickness of 0.15μ on the substrate 110 by sputtering, and the photosensitive polyimide film 170 is formed thereon, over the entire surface (FIG. 2(A1)). The photosensitive polyimide film 170 is then exposed according to the pixel region pattern, and developed to remove the unnecessary portions (FIG. 2(A2)). The chromium film 120 is etched, using the photosensitive polyimide film 170 as a mask, and the openings 111 are formed. In this step the banks 112 comprising the chromium film (lower layer) and photosensitive polyimide film (upper layer) are formed (FIG. 2(A3)). After that, the color filter substrate is fabricated according to the steps diagrammed in (C) to (F) in FIG. 1.

Based on this first modification, because the banks are given the two-layer structure comprising the chromium film and the photosensitive polyimide film, the substrate surface design processes (i.e. treating to give the banks ink repellency and give the substrate ink affinity) are made easy. Also, because the banks are formed without removing the photosensitive polyimide film that functions as the mask in the chromium film etching step, leaving it remaining as is, the manufacturing processes can be simplified.

Besides the photosensitive polyimide film, moreover, a photosensitive organic material such as a polyimide film, acrylic resin film, polyhydroxy styrene film, novolac resin film, polyvinyl alcohol film, or cald resin film or the like can be used.

(Modification 2)

The manufacturing process for a color filter according to a second modification of the first embodiment is now described with reference to FIG. 2 (B1 to B4). What is different in this second modification from the color filter described above is that the banks 112 are given a structure wherein a photosensitive polyimide film 170, resist 130, and chromium film 120 are laminated. First, on the substrate 110 are formed the chromium film 120 (to a film thickness of 0.15μ) and the resist 130 (FIG. 2(B1)). The resist 130 is patterned, and, using that as a mask, the chromium film 120 is etched (FIG. 2(B2)). Then the photosensitive polyimide film 170 is applied to the entire substrate surface without removing the resist 130 (FIG. 2(B3)), and exposed and developed with the same pattern as the chromium film 120, and the unnecessary portions are removed (FIG. 2(B4)). After that, the color filter substrate is fabricated according to the steps diagrammed in (C) to (F) in FIG. 1.

Based on this second modification, the banks are formed of a plurality of photosensitive organic materials, wherefore the substrate surface design processes are made easy by combining these photosensitive organic thin films.

EMBODIMENT 2

A color filter manufacturing process according to a second embodiment of the present invention is now described with reference to FIG. 6. The initial step is diagrammed in FIG. 6(*a*). Here, for the material that forms the light blocking thin film metal layer on the transparent substrate 201, a metal such as chromium, nickel, or aluminum is used, all of which are often used in electronic device fabrication processes. A thin film thereof is caused to adhere to the transparent substrate by a dry plating process to yield a light blocking layer 202. Adequate light blocking performance is obtained if the thickness thereof is 0.1µ or greater, but the limit is 0.5µ in view of concerns about the bondability and brittleness of the metal coating film obtained. The metal may be any metal whatever, and may be selected from a wide range, giving consideration to the ease of thin film formation and the efficiency of the entire process including photoresist etching.

Figure 6:
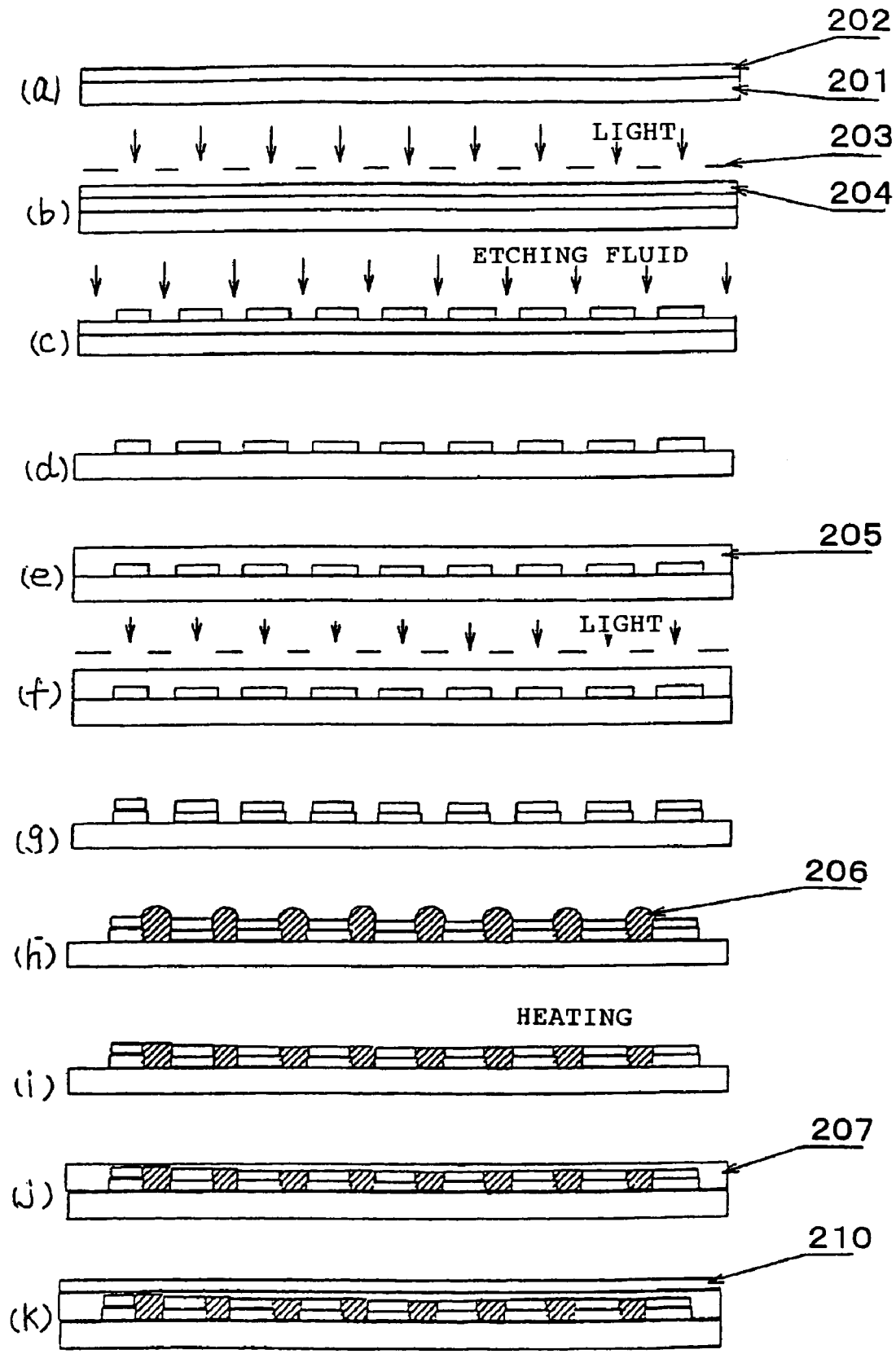
FIG. 6 is a cross-sectional manufacturing process diagram for a color filter according to a second embodiment of the present invention.

Next, as diagrammed at (b) and (c) in FIG. 6, the thin film metal layer in the pattern demarcation gap portions that will become the pixel units on the transparent substrate are removed by a photoresist etching process, and the required matrix pattern shape is obtained (FIG. 6(*d*)).

If the metal thin film light blocking layer described above is made the first layer, then a resin bank layer 205 for demarcating a second layer matrix pattern superimposed thereon is formed within a thickness range of 1.5 to 5µ (FIG. 6(*e*)). The role of the second layer is to partition the matrix pattern gaps where the inks are to be provided, acting as banks, and to prevent mutual color mixing between adjacent inks. A photosensitive resin composition is used as the resin. Then, using a photoresist process, the resin is removed from the matrix pattern gap portions where the inks are to be provided (FIGS. 6(*f*) and 6(*g*)).

The matrix pattern must be such that the first layer pattern and second layer pattern are superimposed. In terms of the precision of this superimposing, on average the first layer pattern width minus the second layer pattern width is plus 5µ, so the first layer pattern width is greater than the second layer pattern width. The bank height in the first layer is determined in relationship to the film thickness of the ink coating film formed in the pixels. The photosensitive resin composition for the second layer may be selected from a wide range of compositions that have an especially large contact angle with water and exhibit outstanding water repellency, and is not limited to a black composition. In the case of the present invention, the object can be attained using a urethane or acrylic photo-hardening type photosensitive resin composition.

The surface is adjusted prior to deploying the ink by dry etching the substrate surface after the patterning described in the foregoing is finished. It is possible to obtain the desired dry etching effect using either UV irradiation or atmospheric pressure plasma irradiation, but the atmospheric pressure plasma etching method is more suitable for configuring the steps in a production line.

Next, as diagrammed in FIG. 6(*h*), inks are deployed in the matrix pattern gaps. For the method of deploying the inks, an ink jet method is employed that involves a printing head used in an ink jet printing mode. As a method for forming ink coating films precisely in areas that are as small as 50µ square, the ink jet printing method is ideal and effective, being able to make the discharged ink drops very minute and to control the number of ink drops discharged.

In order to deploy the very minute ink drops with good precision to the targeted positions 206, that is, in the matrix pattern gaps, it is first necessary to control the size of the ink drops so that they match the size of the targeted matrix pattern gaps. Good results were obtained by controlling the size of the ink drops to from 6 to 30 picoliters for a $50µ^2$ pixel size. Considering throughput, 12 to 20 picoliters is preferable, wherewith good results were obtained. In order to cause the ink drops to fly from the ink jet printing head and arrive at and adhere to the target accurately, conditions must be further managed so that the ink drops fly straight and do not break up during flight.

In this second embodiment, after the deployed ink coating films have adhered, dried, and hardened, means are provided for improving the leveling performance during the drying process so that thickness uniformity is realized, as diagrammed in FIG. 6(*i*).

One of the means is a method wherein a solvent having a high boiling point is added to the deployed ink to reduce the drying speed. Such solvents having a high boiling point include butylcarbitol acetate, methoxybutyl actate, ethoxyethyl propionate, and methoxy-2-propyl acetate. But this poses no limitation, and the solvent can be selected from a wide range of solvents having a boiling point of from 150 to 300° C., taking pigment diffusability and dye solubility or the like into consideration.

Figure 8:
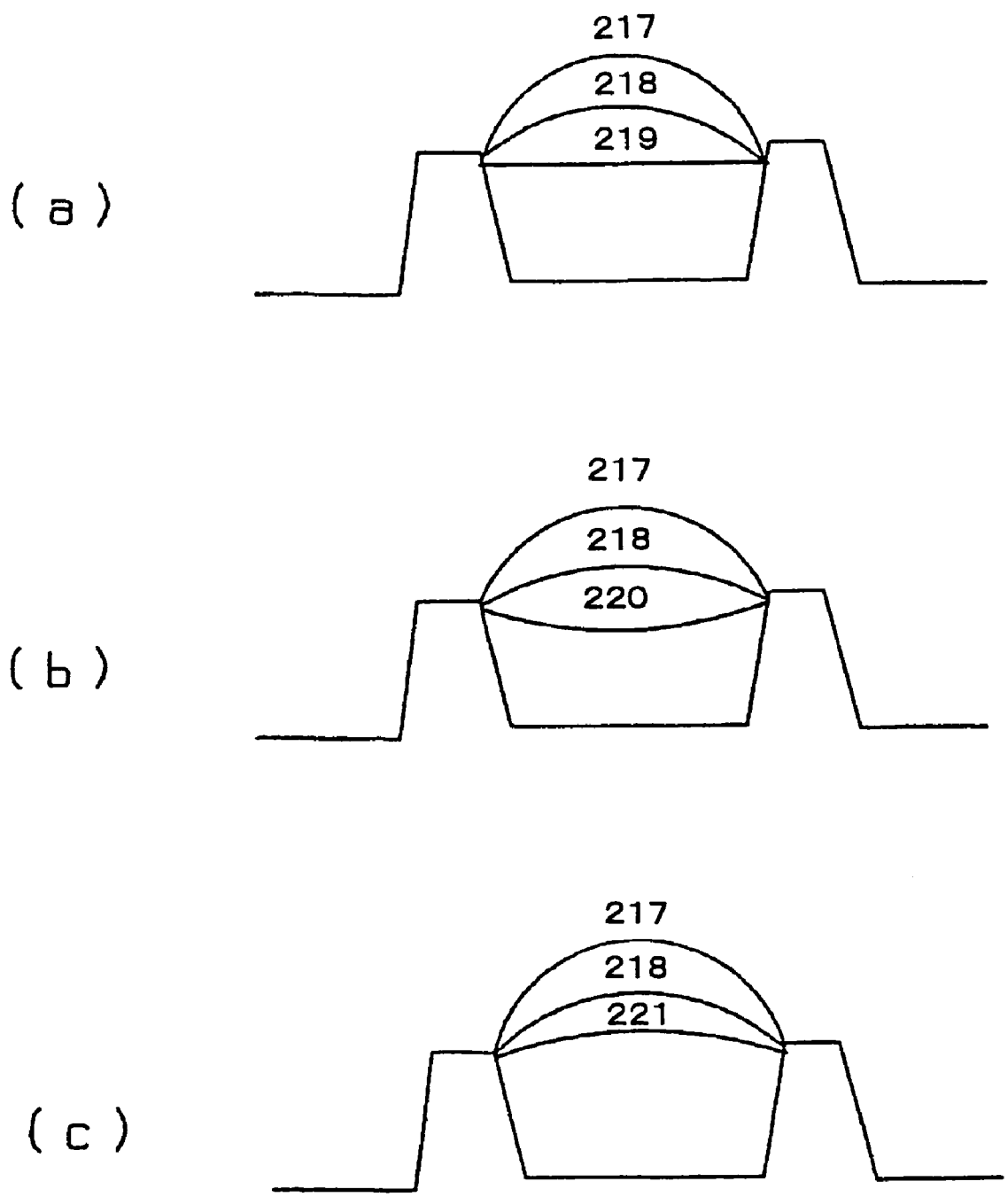
FIG. 8 is a diagram representing ink cross-sectional shapes when drying after ink deployment.

Another of the means is a method that controls the drying speed of the deployed ink. After the ink has been deployed, evaporation proceeds beginning from the solvent components of low boiling point, the viscosity rises while leveling is being done, and the resin portion containing the pigment or dye is crosslinked and hardened by heat. The drying conditions are applied according to the ink properties by combining setting in a natural atmosphere or prebaking at 40 to 100° C., and final baking at 150 to 300° C. The shape designated 217 in FIG. 8(*a*), which is the pixel cross-sectional shape immediately after deploying the ink, passes through the shape designated 218 during drying and becomes the flat coating film 219. The inks possess their own particular viscosities, surface tensions, and fluid characteristics, respectively, and the range and combination of drying conditions noted above must be applied according to the properties peculiar to the inks in order to obtain uniform film thickness after drying. If the drying and hardening conditions do not match the ink properties, the deployed ink coating film thicknesses will become uneven, as indicated by 220 in FIG. 8(*b*) or 221 in FIG. 8(*c*), which in turn will cause variation in pixel color tone.

After the pixel color material coating films have been formed, an overcoat 207 is formed to obtain a smooth surface, as diagrammed in FIG. 6(*j*). Then a thin film common electrode 210 is formed on that surface, as diagrammed in FIG. 6(*k*), and the color filter is completed.

Figure 7:
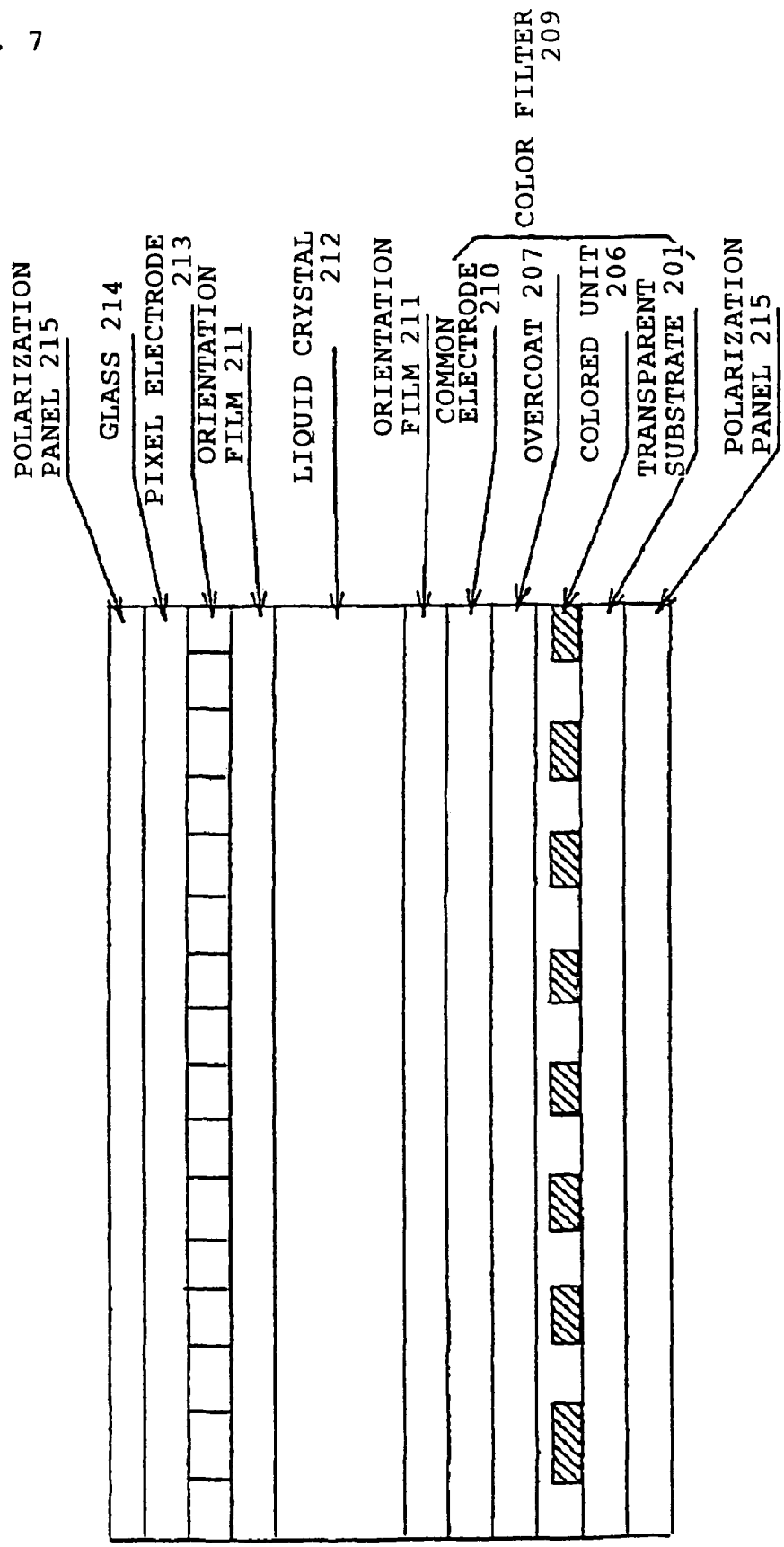
FIG. 7 is a cross-sectional diagram representing the configuration of a liquid crystal display device of the present invention.

In FIG. 7 is diagrammed a cross-section of a TFT color liquid crystal display device which incorporates the color filter described in the foregoing according to this second embodiment. The mode thereof is not limited to this example, however.

A color liquid crystal display device is generally configured by combining a color filter substrate 209 and an opposing substrate 214, and sealing in a liquid crystal composition 212. TFT (not diagrammed) and a thin film pixel electrode 213 are formed in a matrix pattern on the inside of one of the substrates 214 of the liquid crystal display device. As the other substrate, a color filter 209 wherein red, green, and blue pixel color materials are arranged is deployed in a position in opposition to the pixel electrode.

An orientation film 211 is formed inside the two substrate surfaces. By subjecting this orientation film 211 to a rubbing treatment, the liquid crystal molecules can be lined up in one direction. A polarizing panel 215 is bonded on the outside of each of the substrates, and the liquid crystal composition 212 is filled into the gap between these substrates. The combination of a fluorescent bulb (not diagrammed) and a scattering plate is commonly used for the back light, and displays are effected by causing the liquid crystal compound to function as an optical shutter that varies the transmissivity of the light from the back light.

This second embodiment 2 is now described in greater detail in terms of embodiment examples.

EXAMPLE 1

The surface of a non-alkaline transparent glass substrate having a thickness of 0.7 mm, and measuring 38 cm vertically and 30 cm across, was washed with a washing solution made by making a 1% addition of hot concentrated sulfuric acid to hydrogen peroxide, rinsed with pure water, and subjected to air drying to obtain a clean surface. On this surface was formed a chromium coating film, by sputtering, to an average coating film thickness of 0.2µ, to yield a light blocking coating film layer. To this surface was applied the photoresist OFPR-800 (made by Tokyo Ohka) by spin coating. To this substrate surface a matrix film having described thereon a prescribed matrix pattern was made to tightly adhere, and this was subjected to UV exposure. Next, this was immersed in an alkaline developing fluid of 8% potassium hydroxide, and the unexposed photoresist in the pixel portions was removed. Following thereupon, the exposed pixel-unit chromium coating film was removed by etching with an etching fluid having hydrochloric acid as the main component. Thus a chromium thin film light blocking layer (black matrix, abbreviated BM) was obtained that is the first layer of the matrix pattern.

Onto this substrate, as the second layer, a positive type transparent acrylic photosensitive resin composition was applied, again by spin coating. After subjecting this to prebaking for 20 minutes at 100° C., a UV exposure was made using a revised version of the mask used in patterning the chromium matrix pattern. The resin in the pixel portions constituting the unexposed portions was developed, again using an alkaline developing fluid, and this was rinsed in pure water and then spin-dried. Afterbaking was conducted for 30 minutes at 200° C. as the final drying step, and the resin portion was thoroughly hardened. The average thickness of this resin layer coating film was 3.5µ.

In order to enhance the ink wettability of the gaps that would form the pixels, in the two-layer matrix pattern obtained, a dry etching process, that is, an atmospheric pressure plasma treatment was performed. A gas mixture made by adding 20% oxygen to helium was compressed to high pressure, a plasma atmosphere was formed at an atmospheric pressure etching spot, etching was performed by making the substrate to pass below that spot, and both the bank resin parts and pixel units were subjected to an activating treatment. Immediately after that treatment, the contact angle for water with a comparison test plate was an average of 30° on the glass substrate over against an average 50° on the resin coating film.

To the pixel portions in the pattern gaps on this substrate, the inks constituting the color materials were applied by being discharged under high-precision control from an ink jet printing head. A precision head employing a piezoelectric effect was used in the ink jet printing head, and the ink drops were ejected, selectively in the various colors, in minute drops of 20 picoliters, 3 to 8 drops per pixel. In order to enhance flight speed of ink drops to the pixel blanks that are the targets from the head, and to prevent flight turning and broken up drops running astray (called satellites), the physical properties of the ink are of course important, but so are voltage wherewith the piezo elements in the head are driven, and the waveform thereof. Hence waveforms for which conditions were set beforehand were programmed and the inks were discharged and applied simultaneously in the three colors, namely red, green, and blue.

To obtain the inks used, after diffusing an inorganic pigment in a polyurethane resin oligomer, cyclohexanone and butyl acetate were added as solvents having low boiling points and butylcarbitol acetate was added as a solvent having a high boiling point, and 0.01% of a non-ionic surfactant was also added as a diffusing agent, and the viscosity was adjusted to 6 to 8 centipoise.

After this application, drying was conducted by performing by setting the ink coating film layer by allowing the substrate to stand for 3 hours in a natural atmosphere, then heating for 40 minutes on a hot plate at 80° C., and finally heating for 30 minutes at 200° C., thus subjecting the ink coating film to hardening processes. According to these conditions, the variation in ink coating film thickness in the pixels could be suppressed to 10% or lower, and, as a result, the color difference in ink color tone could be held down to 3 or lower.

To the substrate described above, a transparent acrylic resin coating material was applied as an overcoat by spin coating and a smooth surface was obtained. On the upper surface thereof, furthermore, an ITO electrode film was formed in a prescribed pattern to make the color filter. The color filter so obtained passed various endurance tests such as a heat cycle endurance test, ultraviolet irradiation test, and increased humidity test, etc., and it was thus verified that this was fully usable as a liquid crystal display device element substrate.

EXAMPLE 2

The surface of a non-alkaline transparent glass substrate having a thickness of 0.7 mm, and measuring 38 cm vertically and 30 cm across, was washed with a washing solution made by making a 1% addition of hot concentrated sulfuric acid to hydrogen peroxide, rinsed with pure water, and subjected to air drying to obtain a clean surface. On this surface was formed an aluminum coating film, by sputtering, to an average coating film thickness of 0.5µ, to yield a light blocking coating film layer. To this surface was applied the photoresist OFPR-800 (made by Tokyo Ohka) by spin coating. To this substrate surface a matrix film having described thereon a prescribed matrix pattern was made to tightly adhere, and this was subjected to UV exposure. Next, this was immersed in an alkaline developing fluid of 8% potassium hydroxide, and the unexposed aluminum coating film and photoresist in the pixel portions were removed simultaneously. Aluminum is soluble in an alkali, wherefore the etching step using the acid could be omitted, resulting in process simplification.

Onto this substrate, as the second layer, a positive type transparent acrylic photosensitive resin composition was applied, again by spin coating. After subjecting this to prebaking for 20 minutes at 100° C., a UV exposure was made using a revised version of the mask used in patterning the aluminum matrix pattern. The resin in the pixel portions constituting the unexposed portions was developed, again using an alkaline developing fluid, and this was rinsed in pure water and then spin-dried. Afterbaking was conducted for 30 minutes at 200° C. as the final drying step, and the resin portion was thoroughly hardened. The average thickness of the resin layer formed was 4μ.

In order to enhance the ink wettability of the gaps that would form the pixels, in the two-layer matrix pattern obtained, dry etching was done, and a UV irradiation treatment was performed at a wavelength of 270 nm. Immediately after this irradiation treatment, the contact angle for water with a comparison test plate was an average of 35° on the glass substrate over against an average 55° on the resin coating film.

To the pixel portions in the pattern gaps on this substrate, the inks constituting the color materials were applied by being discharged under high-precision control from an ink jet printing head. A precision head employing a piezoelectric effect was used in the ink jet printing head, and the ink drops were ejected and applied, in minute drops of 12 picoliters, 3 to 8 drops per pixel, sequentially for the red, green, and blue colors. In order to enhance speed of ink drops to the pixel blanks that are the targets from the head, and to prevent flight turning, and broken up drops running astray (called satellites), the physical properties of the ink are of course important, but so are voltage wherewith the piezo elements in the head are driven, and the waveform thereof. Hence waveforms for which conditions were set beforehand were programmed and the ink drops were discharged and applied.

To obtain the inks used, after diffusing an inorganic pigment in a polyacrylic resin oligomer, cyclohexanone and butyl acetate were added as solvents having low boiling points and butylcarbitol acetate was added as a solvent having a high boiling point, and 0.05% of a non-ionic surfactant was also added as a diffusing agent, and the viscosity was adjusted to 6 to 8 centipoise.

After the inks were discharged and applied, the drying conditions were matched with the physical properties of each color of ink, and, after the red, green, and blue inks were deployed, drying and hardening were performed, setting those drying conditions sequentially. The fluid characteristics of the red and blue inks are Newtonian, whereupon drying and hardening for each were implemented by setting in a natural atmosphere for 2 hours, heating on a hot plate for 20 minutes at 90° C., and finally heating in an oven for 45 minutes at 180° C. The fluid characteristics of the green ink are non-Newtonian and strongly thixotropic, wherefore, in implementing the drying processes, the setting time was made long at 5 hours., and final baking was done in an oven at 200° C. for 30 minutes. Based on these conditions, the variation in ink coating film thickness in the pixels could be suppressed to 5% or lower, and, as a result, the color difference in ink color tone could be held down to 2 or lower.

To the substrate described above, a transparent acrylic resin coating material was applied as an overcoat by spin coating and a smooth surface was obtained. On the upper surface thereof, furthermore, an ITO electrode film was formed in a prescribed pattern to make the color filter. The color filter so obtained passed various endurance tests such as a heat cycle endurance test, ultraviolet irradiation test, and increased humidity test, etc., and it was thus verified that this was fully usable as a liquid crystal display device element substrate.

EXAMPLE 3

Using the same transparent glass substrate as in the first example described earlier, after performing the surface treatment in the same way, to the surface thereof a thin film nickel layer was formed to a thickness of 0.3μ by a nickel sputtering process to yield a metal light blocking layer. To this surface was applied the photoresist OFPR-800 (made by Tokyo Ohka) by spin coating. The substrate was dried on a hot plate for 5 minutes at 80° C. to yield a photoresit coating. To this substrate surface a matrix film having described thereon a prescribed matrix pattern was made to tightly adhere, and this was subjected to UV exposure. Next, this was immersed in an alkaline developing fluid of 8% potassium hydroxide, and the unexposed photoresist in the pixel portions was removed. Following thereupon, the exposed pixel-unit nickel coating film was removed by etching with an etching fluid having hydrochloric acid as the main component. Thus a nickel thin film light blocking layer (black matrix, abbreviated BM) was obtained that is the first layer of the matrix pattern.

Onto this substrate, as the second layer, a negative type transparent acrylic photosensitive resin composition was applied, again by spin coating. After subjecting this to prebaking for 10 minutes at 140° C., a UV exposure was made using a positive-negative reversed revised version of the mask used in patterning the nickel matrix pattern. The resin in the pixel portions constituting the exposed portions was developed, again using an alkaline developing fluid, and this was rinsed in pure water and then air-dried. Afterbaking was conducted for 20 minutes at 200° C. as the final drying step, and the resin portion was thoroughly hardened. The average thickness of this resin layer coating film was 3μ.

In order to enhance the ink wettability of the gaps that would form the pixels, in the two-layer matrix pattern obtained, a laser beam ashing treatment was administered as the dry etching. Immediately after this irradiation treatment, the contact angle for water with a comparison test plate was an average of 30° on the glass substrate over against an average 55° on the resin coating film.

To the pixel portions in the pattern gaps on this substrate, the inks constituting the color materials were applied by being discharged under high-precision control from an ink jet printing head. A precision head employing a piezoelectric effect was used in the ink jet printing head, and the ink drops were selectively ejected, in minute drops of 10 picoliters, 6 to 12 drops per pixel. In order to enhance flight speed of ink drops to the pixel blanks that are the targets from the head, and to prevent flight turning, and broken up drops running astray (called satellites), the physical properties of the ink are of course important, but so are voltage wherewith the piezo elements in the head are driven, and the waveform thereof. Hence waveforms for which conditions were set beforehand were programmed and the inks were discharged and applied simultaneously in the three colors, namely red, green, and blue.

To obtain the inks used, after diffusing an organic pigment in a polyacrylic resin oligomer, butyl alcohol added as a solvent having a low boiling point while glycerin and ethylene glycol were added as solvents having high boiling points, and 0.01% of a non-ionic surfactant was also added as a diffusing agent, and the viscosity was adjusted to 4 to 6 centipoise.

After this application, drying was conducted by performing by setting the ink coating film layer by allowing the substrate to stand for 3 hours in a natural atmosphere, then heating for 40 minutes on a hot plate at 80° C., and finally heating for 30 minutes at 200° C., thus subjecting the ink coating film to hardening processes. According to these conditions, the variation in ink coating film thickness in the pixels could be suppressed to 10% or lower, and, as a result, the color difference in ink color tone could be held down to 3 or lower.

To the substrate described above, a transparent acrylic resin coating material was applied as an overcoat by spin coating and a smooth surface was obtained. On the upper surface thereof, furthermore, an ITO electrode film was formed in a prescribed pattern to make the color filter. The color filter so obtained passed various endurance tests such as a heat cycle endurance test, ultraviolet irradiation test, and increased humidity test, etc., and it was thus verified that this was fully usable as a liquid crystal display device element substrate.

EMBODIMENT 3

Figure 9:
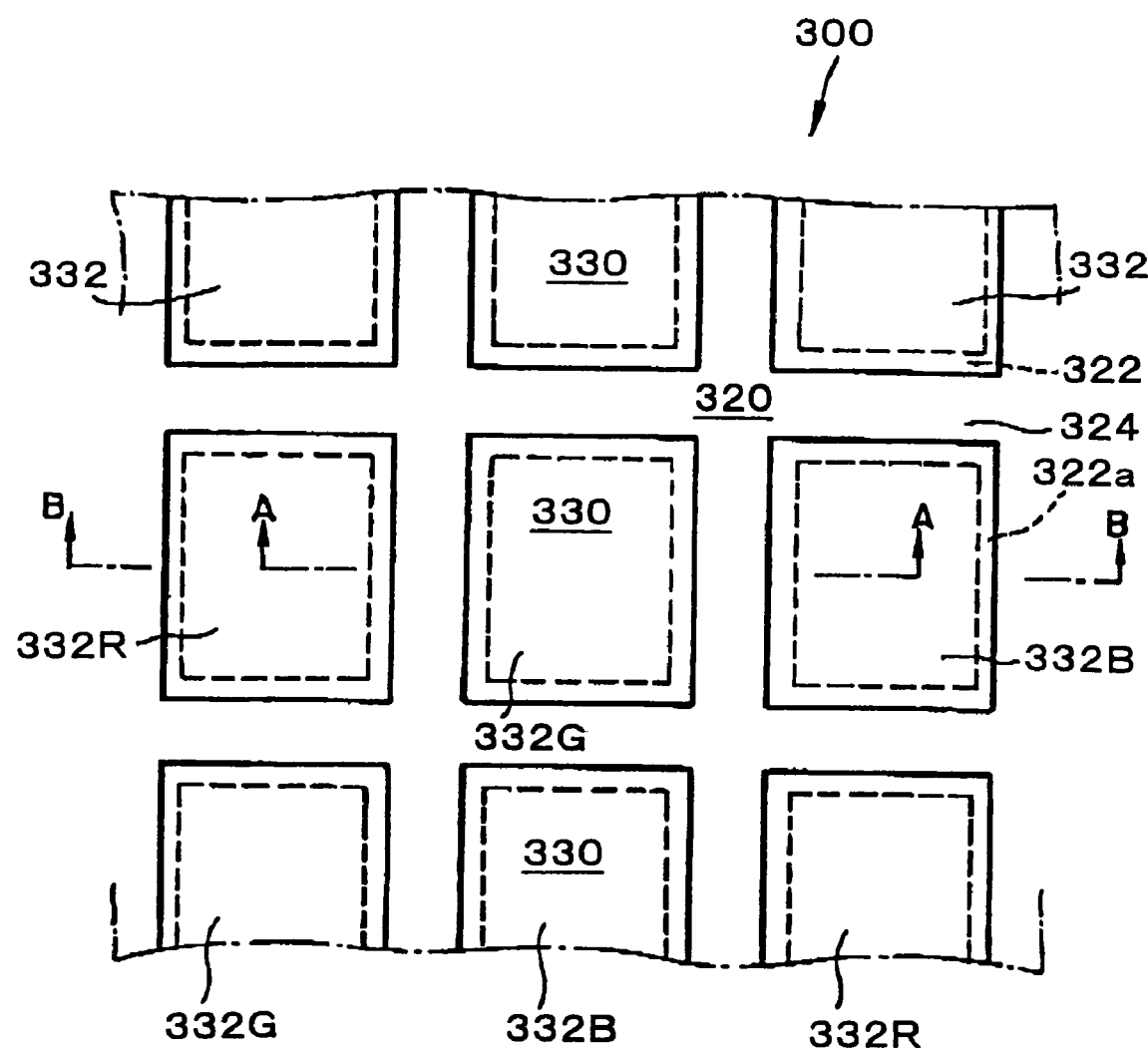
FIG. 9 is a partial cross-section that represents, in model form, a color filter relating to a third embodiment of the present invention.
Figure 10:
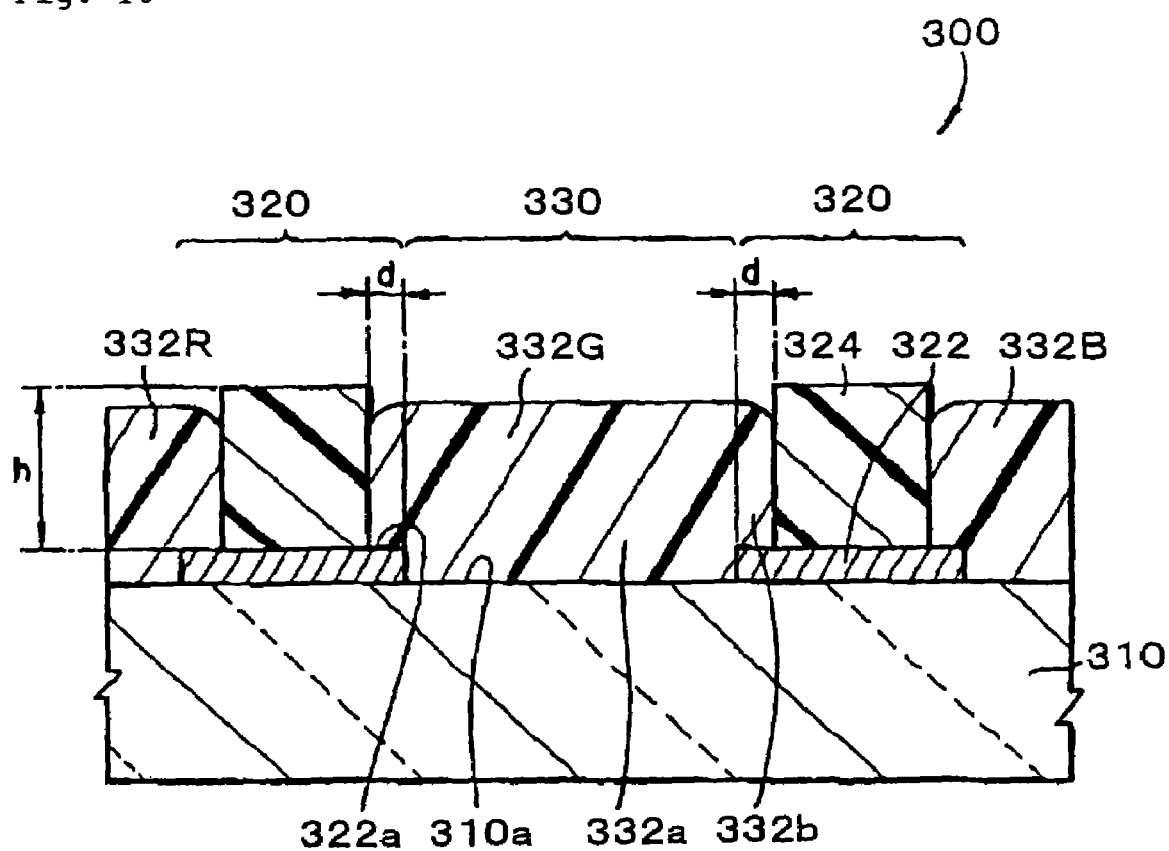
FIG. 10 is a cross-sectional diagram representing in model form a portion along the A—A line in FIG. 9.

FIG. 9 is a partial plan that diagrams in model form a color filter relating to a third embodiment of the present invention. FIG. 10 is a partial cross-section that diagrams in model form a portion cut along the A—A line in FIG. 9.

The color filter 300 relating to this embodiment comprises a transparent substrate 310, light blocking regions 320 that do not substantially transmit light (visible light), and light transmitting regions 330 that are capable of transmitting light. The light blocking regions 320 each have a light blocking layer 322 and a bank layer 324 formed on that light blocking layer 322. The light transmitting regions 330, which are regions that are demarcated by the light blocking regions 320, each have a coloring layer 332 formed on the substrate 310.

The light blocking regions 320 are described first.

The light blocking layers 322 that configure the light blocking regions 320 have a prescribed matrix pattern formed on the substrate 310. The light blocking layer 322 need only exhibit sufficient light blocking qualities and function as a black matrix, and the materials of which it is made, etc., are not particularly limited, so that metals and resins and the like are usable therefor. A metal is preferred as the material for the light blocking layer 322, in the interest of being able to obtain adequate and uniform light blocking performance with a small film thickness. There is no particular limitation of the metal used for the light blocking layer 322, however, and that metal may be selected with a view to the efficiency of the overall process that includes film formation and photoetching. For such metal, preference may be given to metals such as chromium, nickel, and aluminum, etc., which are commonly used in electronic device fabrication processes. When the light blocking layer 322 is configured of a metal, adequate light blocking performance is obtained if the film thickness thereof is 0.1µ or greater, but, taking the bondability and brittleness of the metal layer into consideration, it is preferable that that film thickness be 0.5µ or less.

The bank layer 324, is formed on the light blocking layer 322, and has a prescribed matrix pattern. This bank layer 324 demarcates regions where the coloring layers are to be formed, and prevents intermixing (color mixing) between colors of adjacent coloring layers. Accordingly, the film thickness (height h (cf. FIG. 10)) of the bank layer 324 is established by such relationships as the height of the ink layers, so that the inks injected as color materials when forming the coloring layers will not overflow. From this perspective, the bank layer 324 should be formed in a film thickness range of 1 to 5µ, for example.

Now, this third embodiment is characterized by the fact that the bank layer 324, in the plan-view pattern thereof, is formed one size smaller than the light blocking layer 322. More specifically, the bank layer 324 is formed so that the light blocking layer 322 is exposed by a prescribed width d about the periphery thereof (cf. FIG. 10). It is preferable, moreover, for reasons given subsequently, that the exposed surface 322a on the upper surface of the light blocking layer 322 be continuous.

The bank layer 324 is configured by a resin layer that can be processed by photolithography. Such a photosensitive resin as this need not necessarily exhibit either outstanding water repellency such that the contact angle with water is large, or light blocking properties, and thus can be selected from a wide range of resins. For the resin which configures the bank layer 324, use may be made of a photosensitive resin composition comprising, for example, a urethane resin, acrylic resin, novolac resin, cald resin, polyimide resin, polyhydroxy styrene, or polyvinyl alcohol, etc.

Each of the coloring layers 332 comprises a plurality of coloring layers 332R, 332G, and 332B having the colors red, green, and blue that make up three primary colors of light. These coloring layers are deployed in a prescribed pattern of arrangement, such as a striped arrangement, delta arrangement, or mosaic arrangement, with one pixel being configured by connected coloring layers of three colors.

The coloring layers 332, as diagrammed in FIG. 10, are formed not only on the exposed surfaces 310a of the substrate 310, but also on the exposed surfaces 322a of the light blocking layers 322. And the portions formed on the exposed surfaces 310a of the substrate 310 (those portions hereinafter called "light transmitting portions") 332a configure light transmitting regions 330, which function substantially as coloring layers. By way of contrast, the portions positioned on the exposed surfaces 322a of the light blocking layers 322 (those portions hereinafter called "non-light transmitting portions") 332b, due to the light blocking layers 322, do not substantially transmit light from the substrate 310 side or light to the substrate 310 side, and so do not function as coloring layers.

Thus, by having the non-light transmitting portions 332b that do not function as light transmitting regions 330 formed at the peripheral edges of the coloring layers 332, the film thickness of the light transmitting portions 332a of the coloring layers 332 that do function as light transmitting regions 330 can be made uniform. As a result, color tone irregularities caused by disparities in the film thickness between different portions of the coloring layers can be prevented. The reason why that is so is now explained. At the peripheral edges of the coloring layers 332, that is, the portions that contact the bank layer 324, because of the ink wettability relative to the surface of the bank layer 324, among other things, the film thickness will become either smaller or larger than the other portions. For that reason, it is technically quite difficult to give the coloring layers 332 uniform film thickness across their entire surfaces. According to this third embodiment, however, by superimposing the peripheral edges of the coloring layers 332, where it is particularly hard to achieve uniform film thickness, on portions of the light blocking layers 322, the peripheral edges wherein the film thickness is difficult to control can be made the non-light transmitting portions 332b. As a result, the portions of uneven film thickness that cause color tone irregularities and the like to occur can be eliminated from the light transmitting regions 330.

Accordingly, the width d of the exposed surfaces 322a of the light blocking layers 322 should be established in consideration of such factors as the ink wettability towards the bank layer 324, the effective surface area of the light transmitting regions 330, the relationship between the ink volume and the film thickness, the limitations on making the width of the bank layer narrow, and the ink adherence precision, etc., as discussed in the foregoing, with 1 to 10μ being preferable, and 3 to 5μ being more preferable.

It is also desirable that the exposed surfaces 322a of the light blocking layers 322 be formed continuously in a ring shape along the peripheral edges of the coloring layers 332, that is, along the peripheral edges of the light blocking layers 322, in view of the desirability of having the coloring layers 332 formed in portions having uneven film thickness, as described in the foregoing.

In this third embodiment, furthermore, the peripheral edges at the bottom surface of the bank layer 324 are positioned inside from the peripheral edges of the light blocking layers 322, that is, the side surfaces of the bank layer 324 are drawn back from the side surfaces of the light blocking layers 322, wherefore steps are formed on the light blocking layers 322. As will be described subsequently, these steps function to prevent ink form flowing into neighboring coloring layer formation regions when the coloring layers 332 are being formed. As a result, the occurrence of color mixing in the coloring layers can be suppressed.

(Color Filter Manufacturing Method)

Figure 11:
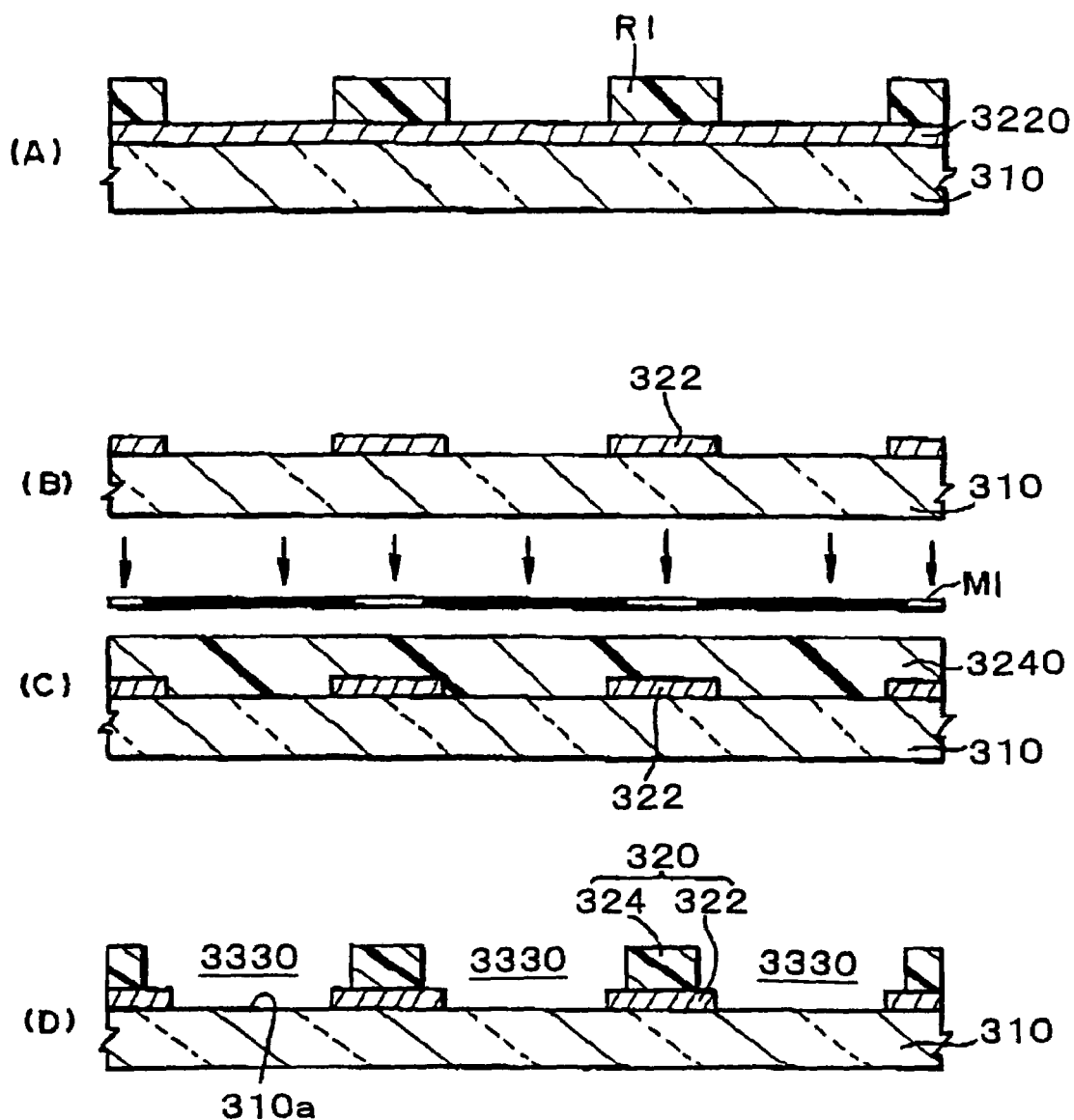
FIG. 11 is a set of partial cross-sections that represent, in model form, manufacturing processes for the color filter diagrammed in FIGS. 9 and 10.
Figure 12:
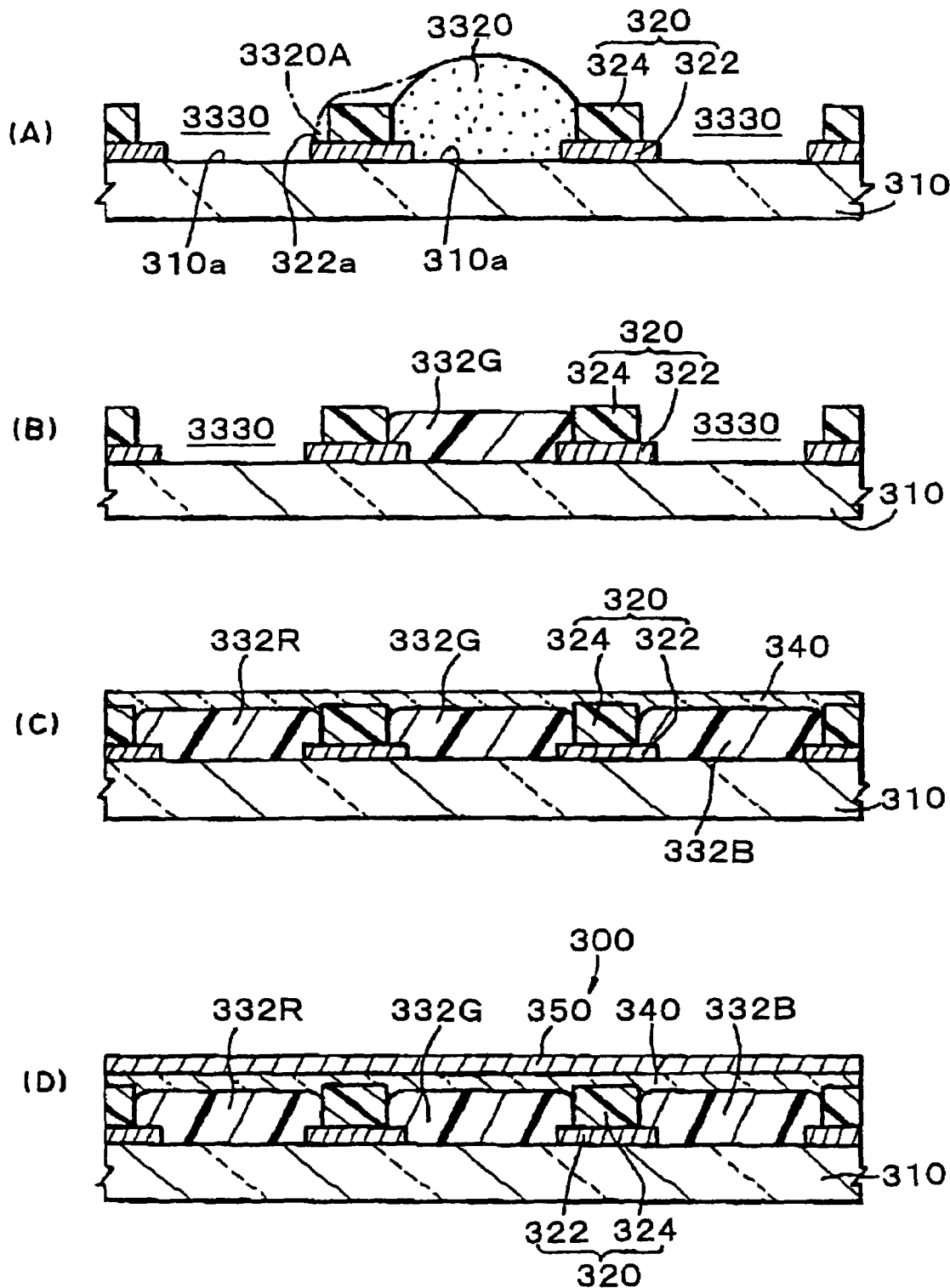
FIG. 12 is a set of partial cross-sections that represent, in model form, manufacturing processes for the color filter diagrammed in FIGS. 9 and 10.

An example of color filter manufacture is described next while referencing FIG. 11 and FIG. 12. FIGS. 11 and 12 are cross-sections that represent, in model form, partial layer structures corresponding to the B—B line in FIG. 9 in each step.

(1) Light Blocking Layer Formation

First, as diagrammed in FIG. 11(A), a metal layer 3220 is built up on a transparent substrate 310, to a film thickness of 0.1 to 0.5μ, by a dry plating process such as sputtering, vapor deposition, or chemical vapor deposition, for example. Various metals such as chromium, nickel, or aluminum may be used as the material for the metal layer 3220, as described earlier. Next, a resist layer R1 having a prescribed pattern is formed by photolithography on the surface of the metal layer 3220. After that, etching is performed, using that resist layer R1 as a mask, and the metal layer 3220 is patterned. Thus, as diagrammed in FIG. 11(B), a light blocking layer 322 having a prescribed matrix pattern is formed on the substrate 310.

(2) Bank Layer Formation

Next, as diagrammed in FIG. 11(C), a resin layer 3240 is formed on the substrate 310 whereon the light blocking layer 322 is formed. This resin layer may be formed by a negative or positive type resist. This resist layer 3240 comprises, for example, a urethane- or acrylic-based photo-hardening photosensitive resin. An exposure is then made, using a photomask M1, and developing is done, thereby patterning the resin layer 3240. Thus, as diagrammed in FIG. 11(D), the bank layer 324 is formed, and the light blocking regions 320 are formed. The configuration of this bank layer 324 has already been described, so no further description thereof is given here. In this step, coloring layer formation regions 3330, demarcated by the light blocking regions 320, are formed in a prescribed matrix pattern.

Next, as necessary, the substrate surface is subjected to surface treatment prior to the next step wherein the coloring layers are formed. Ultraviolet irradiation, plasma irradiation, or laser irradiation and the like may be used as the method of such surface treatment. By performing such surface treatment, contaminating substances adhering to the exposed surfaces 310a of the substrate 310 can be removed, and the contact angle of these surfaces 310a with water can be made smaller and the ink wettability thereof improved. In more specific terms, it is preferable that the difference in contact angle with water between the exposed surfaces 310a of the substrate 310 and the surface of the bank layer 324 should be 15° or greater. Thus, by controlling the contact angles with water of the exposed surfaces 310a of the substrate 310 and of the surface of the bank layer 324, not only can ink be deployed on the exposed surfaces 310a of the coloring layer formation regions 3330 under good bonding conditions, but, due to the property whereby the bank layer 324 repels ink, ink can be prevented from crossing the bank layer 324 and overflowing. For the method of surface treatment, dry etching based on atmospheric pressure irradiation is preferable in view of the suitability for incorporating the step into a production line.

(3) Coloring Layer Formation

First, as diagrammed in FIG. 12(A), ink is deployed in a coloring layer formation region 3330 demarcated by the light blocking layers 322 and the bank layer 324, to form an ink layer 3320. In this third embodiment, the method used for deploying this ink is an ink jet method involving a printing head used in an ink jet printing mode. For a method for forming an ink layer with good precision in a minute coloring layer formation region 3330 that is 50μ square, for example, an ink jet printing method capable of making the ink drops discharged very minute and also controlling the number of ink drops discharged is ideal.

In order to deliver the very fine ink drops precisely to the targeted position (i.e. the exposed surface 310a of the substrate 310), first the size of the ink drops is controlled to match the size of the exposed surface 310a of the coloring layer forming region 3330 that is the target. The size of these ink drops should be controlled to 6 to 30 picoliters for a coloring layer forming region 3330 measuring 50μ square, for example. It is even more preferable that the size of the ink drops be from 12 to 20 picoliters in the interest of throughput. The conditions should also be controlled so that, when the ink drops are caused to fly from the ink jet printing head that the conditions be controlled so that those ink drops fly straight, without breaking up in flight, so that they will arrive at the target accurately.

With this third embodiment also, as was noted when describing the second embodiment earlier, it is preferable that means be comprised for enhancing leveling during the drying of the ink layers. One example of such means is the method of adding a solvent with a high boiling point to the ink to slow down the drying speed. Another example of such means is the method of controlling the drying conditions of the deployed ink. The drying conditions can be applied according to the ink properties by combining setting in a natural atmosphere and/or prebaking at 40 to 100° C. (i.e. at least one of those processes) together with final baking at 150 to 300° C.

In this third embodiment, the coloring layers 332 are sequentially formed in each color, namely red, green, and blue. There is no particular limitation on the order in which these coloring layers 332 are formed. In the example diagrammed in FIG. 12(B), first the green coloring layer 332G is formed, then either the red coloring layer 332R or the blue coloring layer 332B is formed, as diagrammed in FIG. 12(C), then the coloring layer of the remaining color is formed last of all.

In this third embodiment, because the side walls of the bank layer 324 are drawn back from the side walls of the light blocking layer 322, a step is formed on the light blocking layer 322. For this reason, as diagrammed in FIG. 12(A), when an ink layer 3320 is formed in a coloring layer forming region 3330, even if a portion of that ink layer 3320 overflows the bank layer 324, that ink will collect on the step formed by the side walls of the bank layer 324 and the exposed surface 322a of the light blocking layer 322, and so will be prevented from flowing into the exposed surface 310a of the substrate 310 in the neighboring coloring layer forming regions 3330. As a result, the occurrence of coloring layer color mixing due to ink mixing can be prevented.

The coloring layers in the red, green, and blue colors can also be formed simultaneously by selecting a color head or a plurality of heads in an ink jet printing system.

(4) Formation of Overcoat Layer, etc.

Next, as diagrammed in FIG. 12(C), after forming the coloring layers 332, as necessary, an overcoat layer 340 is formed in order to obtain a smooth surface. Then, as diagrammed in FIG. 12(D), as necessary, a common electrode 350 is formed on the overcoat layer 340, and the color filter 300 is completed. This overcoat layer 340 and common electrode 350 can be provided according to the configuration of the electro-optical device in which the color filter is to be employed.

(Operational Benefits)

The main operational benefits of the color filter of the third embodiment are now described.

(a) The bank layer 324 is formed so that, in its plan-view pattern, the width thereof is smaller than that of the light blocking layers 322, and portions of the light blocking layers 322 are exposed. By having these exposed surfaces 322a, non-light transmitting portions 332b that do not function as light transmitting regions 330 are formed at the peripheral edges of the coloring layers 332 where it is difficult to obtain uniform film thickness. As a result, defects such as color tone irregularities do not readily develop in the color filter of this third embodiment, and high contrast is effected, because the film thickness of the light transmitting portions 332a of the coloring layers 332 that do function as light transmitting regions 330 can be made uniform.

(b) By providing the light blocking layers 322 and the bank layer 324, the light blocking function and the demarcation function can each be established independently, wherefore both functions can be manifested without fail. As a result, in the color filter of this embodiment, pixel defects caused by inadequate light blocking or color mixing do not readily develop. By dividing the functions in this manner, moreover, optimal materials for configuring the light blocking layers and bank layer can be selected from a wide range, which is beneficial also in terms of production cost. When the light blocking layers 322 are configured of metal layers, in particular, light blocking performance is obtained that is both adequate and uniform with a small film thickness.

(c) In this third embodiment, the side walls of the bank layer 324 are drawn back from the side walls of the light blocking layers 322, wherefore a step is formed on the light blocking layers 322. Ink can be retained by this step, furthermore, so that, even of a portion of an ink layer overflows the bank layer 324, that ink will be prevented from flowing into the exposed surface 310a of the substrate 310 in neighboring coloring layer formation regions. For that reason, the occurrence of coloring layer color mixing due to ink mixing can be prevented. As a result, defects such as color tone irregularities do not readily develop in the color filter of this embodiment, and high contrast is effected.

As based on the manufacturing method for the color filter of this embodiment, moreover, the following operational benefits are realized.

(a) Based on the manufacturing method for the color filter of this embodiment, the color filter of this embodiment can be formed with few steps. More specifically, by forming the coloring layers with an ink jet method, the step of patterning using photolithography can be eliminated, and the process simplified. Also, because inks are made to adhere to the coloring layers with the ink jet method, the inks can be delivered only to the necessary coloring layer forming regions. For that reason, there is no loss of color materials as with patterning using photolithography, wherewith unnecessary portions are removed, and the cost of the color filters can be reduced.

(b) In this embodiment, by subjecting the substrate surface to surface treatment prior to forming the coloring layers, contaminating matter adhering to the exposed surface 310a of the substrate 310 can be removed, the contact angle of that surface 310a with water can be made small, and ink wettability can be enhanced. Thus, by controlling the contact angles with water of the exposed surface 310a of the substrate 310 and of the surface of the bank layer 324, ink can be deployed on the exposed surface 310a of the coloring layer formation regions 3330 in a condition of good bonding, and, in addition, due to the ink repelling property of the bank layer 324, the ink is kept from crossing and overflowing the bank layer 324. During the ink drying process, moreover, film thickness irregularities caused by ink being pulled to the bank layer are suppressed.

(Color Filter Modification)

Figure 13:
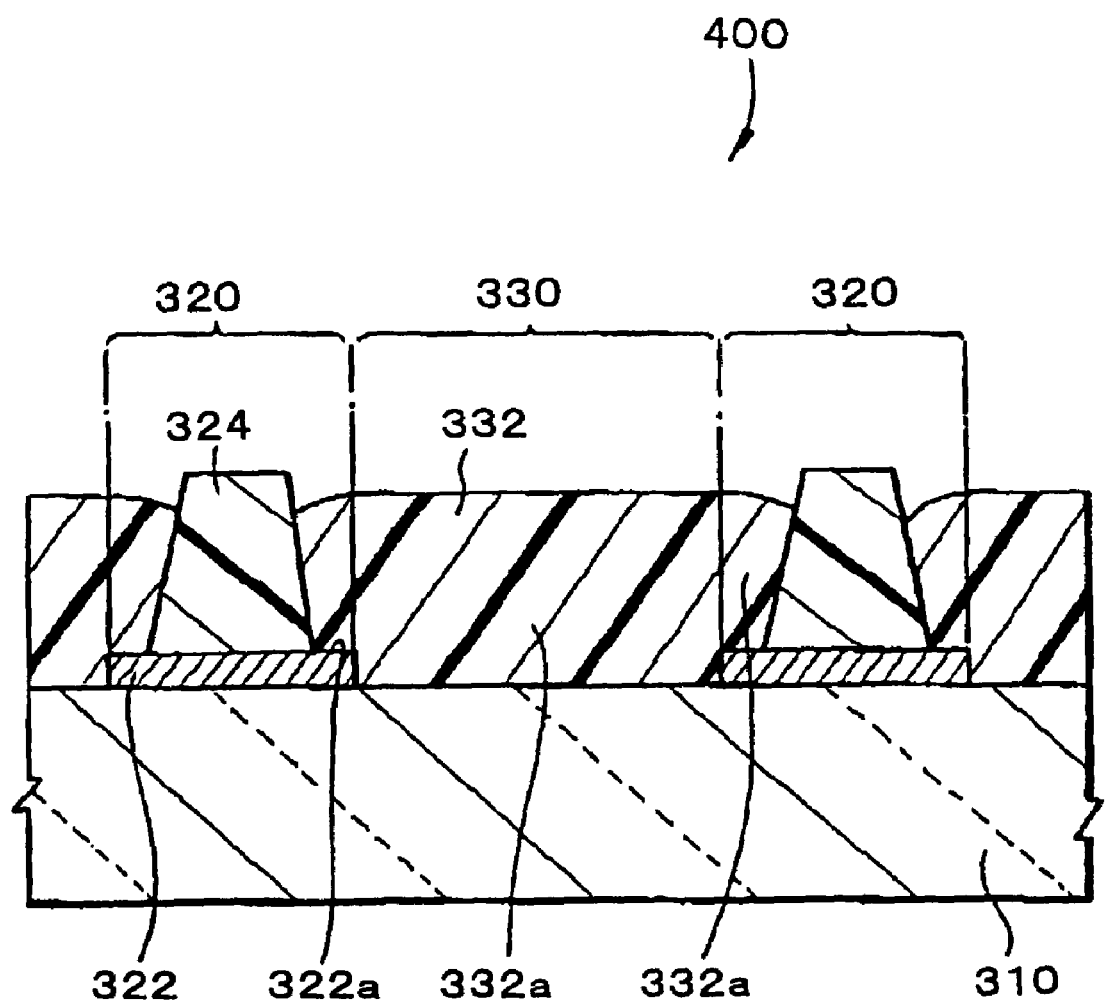
FIG. 13 is a partial cross-section representing a modification of the color filter relating to the third embodiment.

FIG. 13 is a partial cross-section that represents, in model form, a modification of the color filter relating to this third embodiment. The color filter 400 diagrammed in FIG. 13 corresponds to FIG. 10 that diagrams the color filter 300 described in the foregoing. In the color filter 400, for parts having substantially the same function as the color filter 300 diagrammed in FIGS. 9 and 10, the same symbols as were used in FIGS. 9 and 10 are used, and no further description thereof is given here.

In the color filter 400 in this modification, the shape of the bank layer 324 is different than in the color filter 300 described earlier. In this modification, the cross-sectional shape of the bank layer 324 in the width dimension forms a tapered configuration, having a roughly trapezoidal shape with the width smaller at the upper end than at the lower end.

Because the bank layer 324 has such a tapered shape as this, the following advantages are realized in addition to the operational benefits of the color filter 300 described earlier.

That is, by the bank layer 324 having such a tapered shape as this, adequate width can be secured in the upper part of the non-light transmitting portions 332b of the coloring layers 332. As a result, the width of the exposed surfaces 322a of the light blocking layers 322 can be made relatively smaller, the effective surface area of the light transmitting regions 330 relative to the surface of the substrate 310 can be made larger, and larger surface area capable of contributing to the pixel regions can be secured.

The tapered bank layer 324 can be formed by the following method, for example.

A photosensitive resin is coated uniformly over the entire surface whereon the light blocking layers are formed. Spin coating is a typical method for this coating process, but a printing, film transfer, or bar coating method or the like may be used instead. A negative type photomask is prepared, alignment exposure is performed, and the portions irradiated by light are hardened by a reaction. Then if developing and baking are performed, the bank layer is complete. The angle of bank layer taper can be controlled by adjusting the sensitivity of the material.

EMBODIMENT EXAMPLES

This third embodiment is now described in greater detail in terms of examples.

The surface of a transparent substrate made of non-alkaline glass and measuring 0.7 mm in film thickness, 38 cm vertically, and 30 communication across was washed in a cleaning fluid of hot concentrated sulfuric acid to which 1 wt. % of hydrogen peroxide had been added, rinsed with pure water, and then air dried to yield a clean surface. On this surface was formed a chromium film having an average film thickness of 0.2μ to obtain a metal layer. To the surface of this metal layer was applied the photoresist OFPR-800 (made by Tokyo Ohka) by spin coating. The substrate was dried for 5 minutes at 80° C. on a hot plate, and a photoresist layer was formed. To the surface of this substrate, a mask film whereon the prescribed matrix pattern shape was drawn was made to tightly adhere, and an exposure was made with ultraviolet light. Next, this was immersed in an alkaline developing fluid containing 8 wt. % of potassium hydroxide, the unexposed portions of the photoresist were removed, and the resist layer was patterned. Following thereupon, the exposed metal layer was removed by etching with an etching fluid containing hydrochloric acid as its main component. Thus was obtained a light blocking layer (black matrix) having a prescribed matrix pattern. The film thickness of the light blocking layer was about 0.2μ. The width of the light blocking layer was about 22μ.

On this substrate a negative type transparent acrylic photosensitive resin composition was also applied, again by spin coating. After prebaking for 20 minutes at 100° C., ultraviolet exposure was performed using a mask film having a prescribed matrix pattern shape drawn thereon. The unexposed portions of the resin were developed with an alkaline developing fluid, and the substrate was rinsed in pure water and then spin dried. Afterbaking was conducted for 30 minutes at 200° C. as the final drying process, the resin portions were thoroughly hardened, and the bank layer was formed. The average film thickness of this bank layer was 3.5μ. The width of the bank layer was about 14μ. And a ring shaped exposure surface having a width of about 4μ was formed on the upper surface of the light blocking layer.

In order to improve the ink wettability of the coloring layer forming regions demarcated on the bank layer and the light blocking layer, dry etching, that is, an atmospheric pressure plasma treatment was performed. A gas mixture in which 20% oxygen was added to helium was compressed to a high pressure, a plasma atmosphere was formed into an etching spot within atmospheric pressure, the substrate was passed below that etching spot and etched, and both the bank layer and the coloring layer formation regions (exposed surfaces of glass substrate) were subjected to an activation treatment. Immediately after this treatment, the contact angle for water with a comparison test plate was an average of 35° on the glass substrate over against an average 50° on the bank layer.

To these coloring layer formation regions, inks were applied, discharging the inks constituting color materials from an ink jet printing head under high-precision control. A precision head employing a piezoelectric effect was used in the ink jet printing head, and the ink drops were selectively ejected, in minute drops of 20 picoliters, 3 to 8 drops per coloring formation region. In order to enhance flight speed of ink drops to the coloring layer formation regions that are the targets from the head, and to prevent flight turning, and broken up drops running astray (called satellites), the physical properties of the ink are of course important, but so are voltage wherewith the piezo elements in the head are driven, and the waveform thereof. Hence waveforms for which conditions were set beforehand were programmed and the inks were discharged and applied simultaneously in the three colors, namely red, green, and blue.

To obtain the inks used, after diffusing inorganic pigments in a polyurethane resin oligomer, cyclohexanone and butyl acetate were added as solvents having low boiling points while butylcarbitol acetate was added as a solvent having a high boiling point, and 0.01 wt. % of a non-ionic surfactant was also added as a diffusing agent, and the viscosity was adjusted to 6 to 8 centipoise.

After this application, the ink layer was set by allowing the substrate to stand for 3 hours in a natural atmosphere, then heating was performed for 40 minutes on a hot plate at 80° C., and finally heating was performed for 30 minutes at 200° C., thus subjecting the ink layer to hardening processes, and yielding the coloring layer. According to these conditions, the variation in the film thickness in the coloring layer, and particularly in the light transmitting portions thereof, could be suppressed to 10% or lower, and, as a result, the color difference in ink color tone in the coloring layer could be held down to 3 or lower, or even to 2 or lower.

To the substrate described above, a transparent acrylic resin coating material was applied by spin coating to obtain an overcoat layer having a smooth surface. On the upper surface thereof, furthermore, an electrode layer made of ITO was formed in a prescribed pattern, and a color filter was made. The color filter so obtained passed various endurance tests such as a heat cycle endurance test, ultraviolet irradiation test, and increased humidity test, etc., and it was thus verified that this was fully usable as a an element substrate such as a liquid crystal display device.

(Electro-Optical Device)

Figure 14:
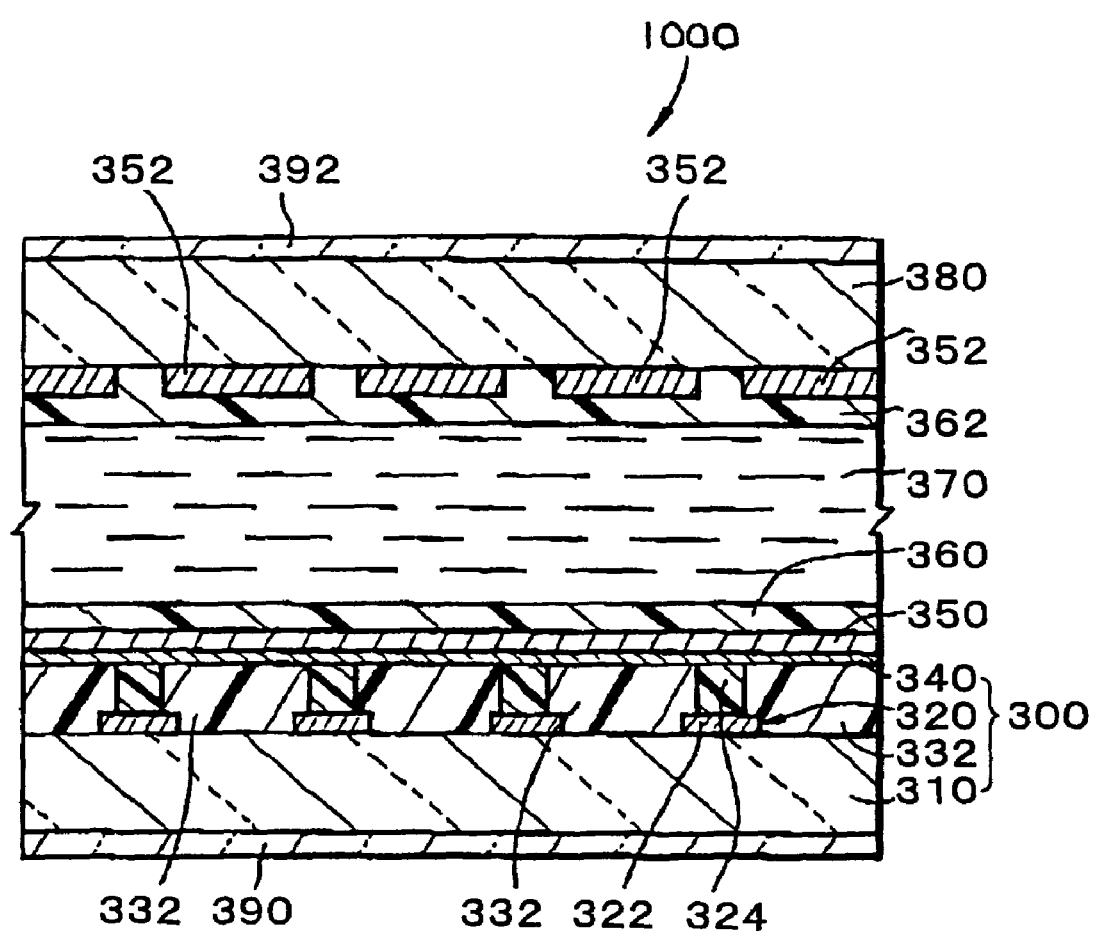
FIG. 14 is a partial cross-section of a liquid crystal display device wherein is employed an electro-optical device that comprises a color filter relating to the present invention.

In FIG. 14 is represented a cross-section of a color liquid crystal display device, given as one example of an electro-optical device incorporating the color filter relating to the present invention.

A color liquid crystal display device 1000 is commonly configured by incorporating a color filter 300 and an opposing substrate 380, and sealing a liquid crystal composition 370 between the two. On the surface on the inner side of one substrate 380 of the liquid crystal display device 1000, TFT (thin film transistor) elements (not shown) and pixel electrodes 352 are formed in a matrix pattern. As the other substrate, a color filter 300 is deployed, so that red, green, and blue coloring layers 332 are arranged at positions in opposition to the pixel electrodes 352. On the respective surfaces that are in opposition to the substrate 380 and the color filter 300, orientation films 360 and 362 are formed. These orientation films 360 and 362 are subjected to a rubbing treatment, and the liquid crystal molecules can be lined up in the same direction. To the outside surfaces of the substrate 310 and the color filter 300, moreover, polarizing panels 390 and 392 are bonded, respectively. A combination of a fluorescent bulb (not shown) and a diffusion plate are usually used as the back light, and color displays are effected by causing the liquid crystal compound to function as an optical shutter that varies the transmissivity of the light from the back light.

(Electronic Equipment)

An example of electronic equipment wherein the color filters in the first, second, and third embodiments of the present invention are used is now described.

Figure 15:
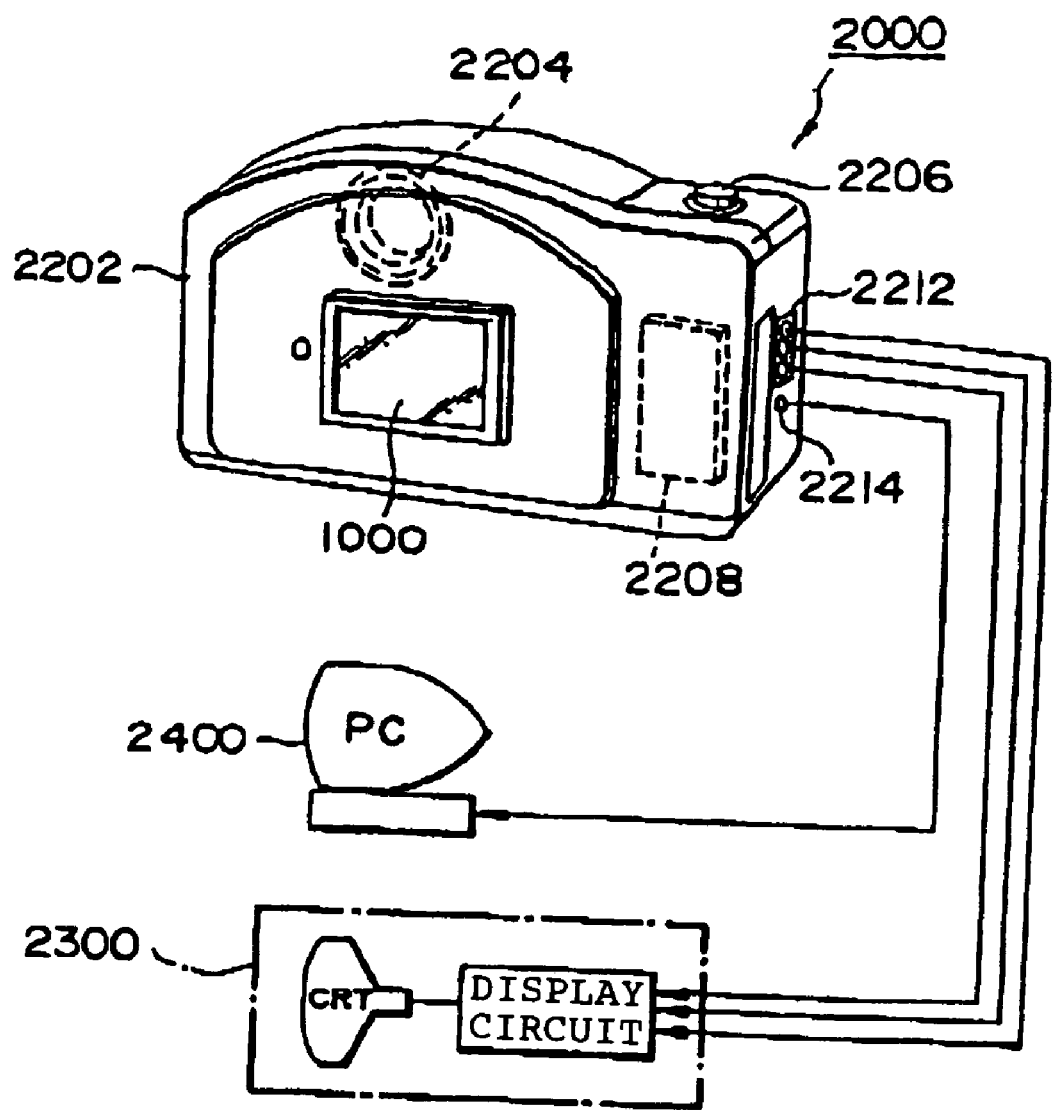
FIG. 15 is a diagonal diagram that represents, in model form, a digital still camera that uses a color filter relating to the present invention.

FIG. 15 is a diagonal view showing the configuration of a digital still camera wherein a liquid crystal display device 1000 wherein the color filter relating to the present invention is employed is used as the view finder. This figure also shows in simple form how connections are made to external equipment.

Whereas an ordinary camera exposes a film by the optical image of the object being photographed, the digital still camera 2000 takes the optical image of the object being photographed, makes a photoelectric conversion using an image pickup element such as a CCD (charge coupled device), and generates image pickup signals. Here, the liquid crystal panel of the liquid crystal display device 1000 described above is deployed on the back side (shown as the front side in FIG. 15) of the case 2202 of the digital still camera 2000, in a configuration wherein a display is made based on image pickup signals from the CCD. For this reason, the liquid crystal display device 1000 functions as a view finder which displays the object being photographed. On the front side (the back side as shown in FIG. 15) of the case 2202, a light receiving unit 2204 comprising an optical lens and CCD, etc., is deployed.

Here, the photographer verifies the object being photographed displayed on the liquid crystal display device 1000, and then depresses a shutter button 2206. Thereupon, the CCD image pickup signals at that point in time are sent to and stored in a circuit board 2208 memory. In this digital still camera 2000, furthermore, on the side surface of the case 2202, video signal output terminals 2212 and a data communications I/O terminal 2214 are provided. As necessary, moreover, as diagrammed in FIG. 15, a television monitor 2300 may be connected to the former, that is, to the video signal output terminals 2212, and a personal computer 2400 may be connected to the latter, that is, to the data communications I/O terminal 2214. Also, the image pickup signals stored in the circuit board 2208 memory can be output to the television monitor 2300 or to the personal computer 2400, by making prescribed control inputs.

Figure 16:
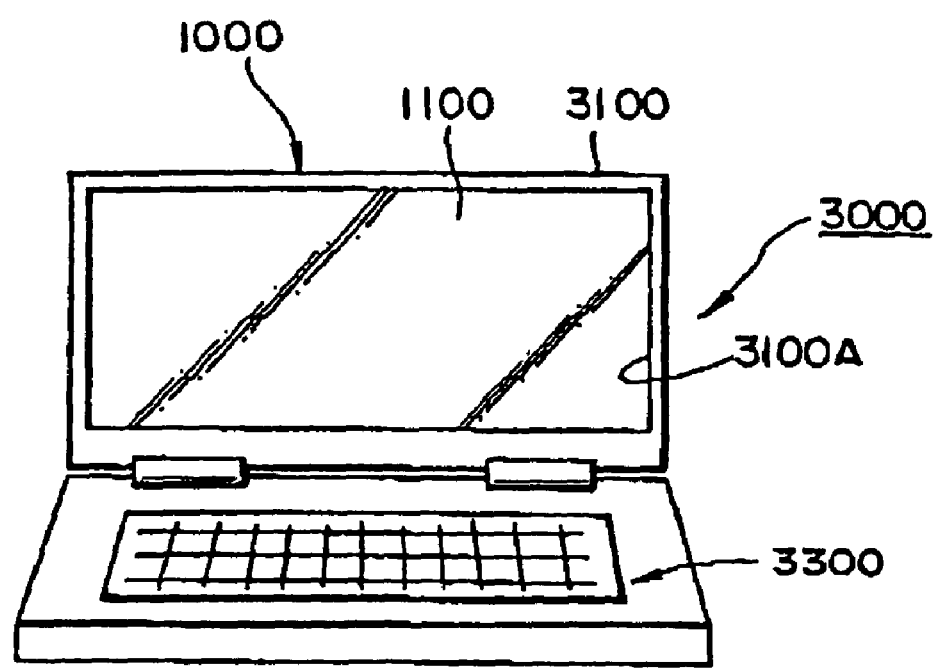
FIG. 16 is a diagonal diagram that represents, in model form, a personal computer that uses a color filter relating to the present invention.

FIG. 16 represents a notebook type personal computer 3000 given as another example of electronic equipment using the liquid crystal display device 1000 wherein the color filter relation to the present invention is employed is used as a display unit. As diagrammed in this figure, the liquid crystal display panel 1100 of the liquid crystal display device 1000 is housed in a case 3100, in a configuration wherein the display region of the liquid crystal display pattern 1100 is exposed through an opening 3100A formed in the case 3100. The personal computer 3000 also comprises a keyboard 3300 as the input unit.

These pieces of equipment, namely the digital still camera 2000 and the personal computer 3000, have a liquid crystal display device 1000 comprising the color filter relating to the present invention, wherefore image displays can be made that exhibit high contrast, without color tone irregularities or other pixel flaws, and lower costs can also be effected.

These pieces of electronic equipment are configured comprising, in addition to the liquid crystal display device 1000, display signal generators comprising in turn various kinds of circuits such as display information output sources, display information processing circuits, and clock signal generating circuits, and power supply circuits for supplying electric power to those circuits. In the display unit, in the case of the personal computer 3000, for example, display images are formed by the supply of display signals generated by a display signal generator on the basis of information and the like input from the input unit 3300.

The electronic equipment wherein the liquid crystal display device relating to the present invention may be incorporated is not limited to digital still cameras and personal computers, but may be all kinds of electronic equipment such as electronic notebooks, pagers, POS terminals, IC cards, minidisc players, liquid crystal projectors, multimedia compatible personal computers (PCs) and engineering workstations (EWSs), word processors, television receivers, video tape recorders (whether of the viewfinder or direct monitor viewing type), electronic desktop calculators, automobile navigation equipment, devices comprising a touch panel, clocks and watches, and game equipment.

Various types of liquid crystal panel may be used for the liquid crystal display panel. In terms of the drive scheme, these include simple matrix liquid crystal display panels and static drive liquid crystal display panels that do not employ switching elements in the panel itself, and also active matrix liquid crystal display panels that use either three-terminal switching elements (typified by TFTs (thin film transistors)) or two-terminal switching elements (typified by TFDS (thin film diodes)). In terms of electro-optical characteristics, these include the TN type, STN type, guest-host type, mutual transfer type, and ferroelectric type, etc.

Devices relating to the present invention have been described in terms of a number of specific embodiments therefor, but the present invention is capable of various modifications within the range of its essential features. In the embodiments described in the foregoing, for example, the descriptions are for cases where an liquid crystal display is used as the image display means (electro-optical display unit) in an electro-optical apparatus. However, the present invention is not limited thereto or thereby, but may instead use a thin type cathode ray tube, or a small television using an liquid crystal shutter or the like, or an electro-luminescence display device, plasma display, CRT display, FED (field emission display) panel, etc.

The industrial usefulness of the present invention is now discussed. Based on the color filter of the present invention, the banks are given a laminar structure comprising a metal film and a photosensitive organic thin film, wherefore treating the substrate to impart ink affinity and treating the banks to impart ink repellency are made easy. In particular, the ink repellency of the banks can be adjusted by adding a fluorine-based surfactant to the photosensitive organic thin film or mixing in a fluorine-based polymer. Accordingly, a liquid crystal display device comprising the color filters of the present invention exhibit very fine characteristics without coloring or display irregularities.

Based on the color filter manufacturing method of the present invention, color filters can be provided which comprise banks well suited to the ink jet process. In particular, because the banks are used as they are, without removing the resist used to etch the metal film, the manufacturing process can be simplified, and low-cost color filters can be manufactured.

Based on the present invention, inks can be deployed precisely and very efficiently in very fine matrix pattern gaps by a precision-control printing head. By controlling the physical properties of the inks, and selecting drying conditions that match those physical properties after the inks have been deployed, uniformity of ink coating film thickness is obtained, and color tone irregularities can in practice be made a color difference of 3 or lower. By applying an overcoat to this substrate, and forming a thin film electrode, the color filter is completed. By using this color filter, it is easy to obtain liquid crystal display devices exhibiting outstanding color characteristics such as contrast using energy saving processes.

The invention claimed is:

1. A method of manufacturing a color filter comprising:
   a step of demarcating and forming a metal film on a substrate;
   a step of forming banks on the substrate by forming a plurality of photosensitive organic thin film layers on the metal film;
   a step of applying inks to each area enclosed by said banks;
   a step of forming ink layers by drying said inks at a temperature of 200° C.;
   a step of forming a protective film that covers said banks and said ink layers; and
   a step of drying said protective film at a temperature of 220° C.

2. The method of manufacturing a color filter according to claim 1, wherein a black matrix is formed in said banks.

3. The method of manufacturing a color filter according to claim 1, wherein a composition of said banks is the same as a composition of said protective film.

4. A method for manufacturing a display device having a color filter, wherein said color filter is formed by a technique comprising:
   a step of demarcating and forming a metal film on a substrate;
   a step of forming banks on the substrate by forming a plurality of photosensitive organic thin film layers on the metal film;
   a step of applying inks to each area enclosed in said banks;
   a step of forming ink layers by drying said inks at a temperature of 200° C.;
   a step of forming a protective film that covers said banks and said ink layers; and
   a step of drying said protective film at a temperature of 220° C.

5. The method of manufacturing a display device according to claim 4, wherein a black matrix is formed in said banks.

6. The method of manufacturing a display device according to claim 4, wherein a composition of said banks is the same as a composition of said protective films.

7. A method for manufacturing an electronic device having a display device that has a color filter, wherein said color filter is formed by a technique comprising:
   a step of demarcating and forming a metal film on a substrate;
   a step of forming banks on the substrate by forming a photosensitive organic thin film layer on the metal film;
   a step of applying inks to each area enclosed in said banks;
   a step of forming ink layers by drying said inks at a temperature of 200° C.;
   a step of forming a protective film that covers said banks and said ink layers; and
   a step of drying said protective film at a temperature of 220° C.

8. A method of manufacturing a color filter comprising:
   a step of demarcating and forming a metal film on a substrate;
   a step of forming banks on the substrate by forming a photosensitive organic thin film layer on the metal film;
   a step of applying inks comprising a solvent having a high boiling point to each area enclosed in said banks; and
   a step of forming ink layers by drying said inks,
   wherein said step of forming ink layers comprises a process of setting or prebaking at a temperature of from 40 to 100° C., and a process of final baking at a temperature of from 160 to 200° C.

* * * * *